US011127460B2

(12) United States Patent
Asnaashari et al.

(10) Patent No.: US 11,127,460 B2
(45) Date of Patent: Sep. 21, 2021

(54) RESISTIVE RANDOM ACCESS MEMORY MATRIX MULTIPLICATION STRUCTURES AND METHODS

(71) Applicant: Crossbar, Inc., Santa Clara, CA (US)

(72) Inventors: Mehdi Asnaashari, Danville, CA (US); Hagop Nazarian, San Jose, CA (US); Christophe Sucur, San Jose, CA (US); Sylvain Dubois, San Francisco, CA (US)

(73) Assignee: Crossbar, Inc., Santa Clara, CA (US)

( * ) Notice: Subject to any disclaimer, the term of this patent is extended or adjusted under 35 U.S.C. 154(b) by 113 days.

(21) Appl. No.: 16/144,765

(22) Filed: Sep. 27, 2018

(65) Prior Publication Data

US 2019/0102358 A1 Apr. 4, 2019

Related U.S. Application Data

(60) Provisional application No. 62/566,001, filed on Sep. 29, 2017.

(51) Int. Cl.
*G11C 13/00* (2006.01)
*G11C 7/18* (2006.01)
(Continued)

(52) U.S. Cl.
CPC .......... *G11C 13/0069* (2013.01); *G06F 17/16* (2013.01); *G11C 7/18* (2013.01); *G11C 8/12* (2013.01); *G11C 8/14* (2013.01); *G11C 29/42* (2013.01); *G11C 29/4401* (2013.01); *G11C 13/003* (2013.01); *G11C 13/004* (2013.01); *G11C 13/0023* (2013.01);
(Continued)

(58) Field of Classification Search
CPC ........................ G11C 13/0069; G06F 17/16
See application file for complete search history.

(56) References Cited

U.S. PATENT DOCUMENTS 6,163,481 A * 12/2000 Yamada ................... G11C 8/08
365/185.05
7,095,642 B1 8/2006 Parent et al.
(Continued)

FOREIGN PATENT DOCUMENTS

WO 2017131792 8/2017

OTHER PUBLICATIONS

Examination Report for corresponding Taiwanese Patent Application No. 107134397 dated Oct. 7, 2019, 18 pages long.
(Continued)

*Primary Examiner* — Michael D. Yaary
(74) *Attorney, Agent, or Firm* — Wegman Hessler

(57) ABSTRACT

Provided herein resistive random access memory matrix multiplication structures and methods. A non-volatile memory logic system can comprise a bit line and at a set of wordlines. Also included can be a set of resistive switching memory cells at respective intersections between the bit line and the set of wordlines. The set of resistive switching memory cells are programmed with a value of an input data bit of a first data matrix and receive respective currents on the set of wordlines. The respective currents comprise respective values of an activation data bit of a second data matrix. A resulting value based on a matrix multiplication corresponds to an output value of the bit line.

20 Claims, 23 Drawing Sheets

(51) Int. Cl.
*G11C 8/12* (2006.01)
*G11C 29/42* (2006.01)
*G11C 29/44* (2006.01)
*G11C 8/14* (2006.01)
*G06F 17/16* (2006.01)
*G11C 29/04* (2006.01)

(52) U.S. Cl.
CPC ...... *G11C 13/0026* (2013.01); *G11C 13/0028* (2013.01); *G11C 13/0097* (2013.01); *G11C 2029/0411* (2013.01); *G11C 2213/71* (2013.01); *G11C 2213/75* (2013.01); *G11C 2213/79* (2013.01)

(56) References Cited

U.S. PATENT DOCUMENTS

| | | | |
|---|---|---|---|
| 9,524,210 B1 | 12/2016 | Asnaashari | |
| 2008/0025132 A1* | 1/2008 | Fasoli | G11C 17/16 365/230.06 |
| 2008/0025134 A1* | 1/2008 | Scheuerlein | G11C 8/14 365/230.06 |
| 2008/0165598 A1* | 7/2008 | Park | G11C 13/00 365/189.18 |
| 2012/0030396 A1 | 2/2012 | Zhu et al. | |
| 2013/0132685 A1 | 5/2013 | Vogelsang et al. | |
| 2014/0133211 A1 | 5/2014 | Nazarian et al. | |
| 2014/0293674 A1 | 10/2014 | Johnson | |
| 2015/0003156 A1 | 1/2015 | Berckmann et al. | |
| 2015/0009745 A1 | 1/2015 | Nguyen et al. | |
| 2016/0189775 A1 | 6/2016 | Buchanan | |
| 2016/0260775 A1 | 9/2016 | Takaki | |
| 2017/0032839 A1 | 2/2017 | Bertin et al. | |
| 2018/0095930 A1* | 4/2018 | Lu | G11C 7/1006 |
| 2018/0114569 A1* | 4/2018 | Strachan | G06N 3/0635 |
| 2019/0006019 A1* | 1/2019 | Wang | G11C 29/028 |

OTHER PUBLICATIONS

Notice of Allowance for corresponding U.S. Appl. No. 16/368,156 dated Mar. 26, 2020, 9 pages long.

Notification of International Preliminary Report on Patentability for corresponding International Patent Application No. PCT/US2018/053544 dated Jan. 17, 2020, 18 pages long.

International Search Report and Written Opinion for corresponding International Patent Application No. PCT/US2018/053544 dated Dec. 4, 2018, 12 pages long.

Notice of Allowance for corresponding U.S. Appl. No. 16/144,771 dated Feb. 20, 2020 8 pages long.

Notice of Allowance for corresponding Taiwan Patent Application No. 107134397 dated May 13, 2020, 4 pages long.

* cited by examiner

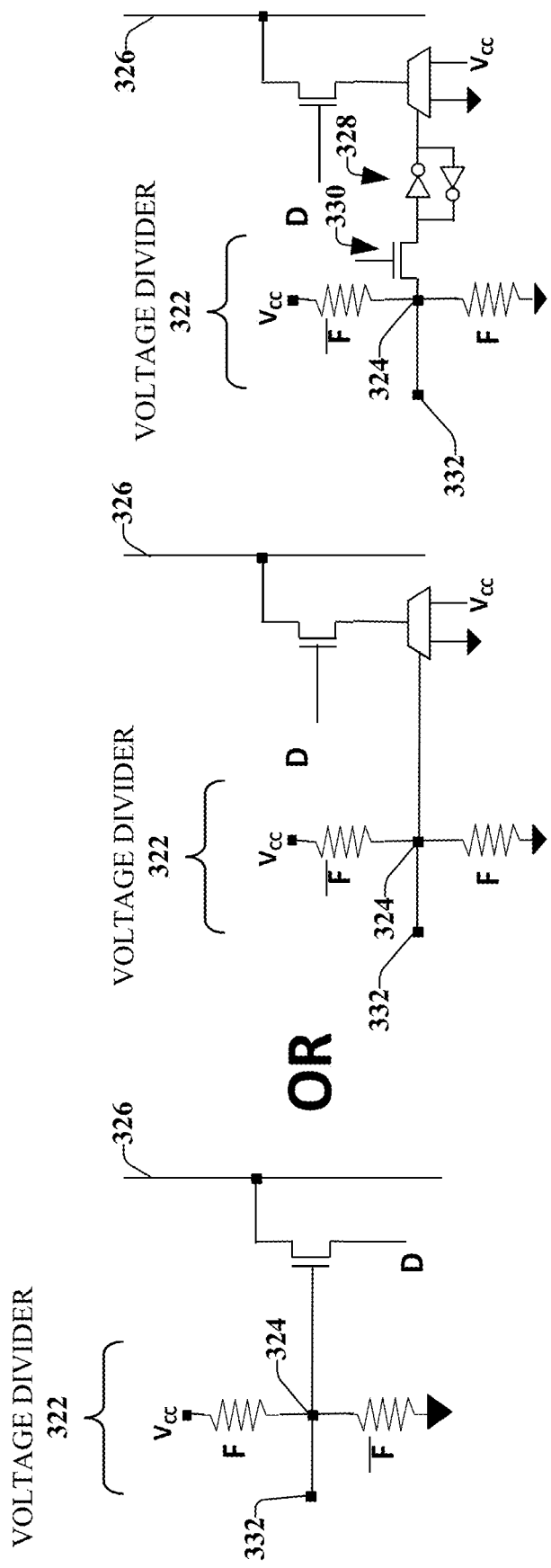

RESISTIVE RANDOM ACCESS MEMORY MATRIX MULTIPLICATION STRUCTURES AND METHODS

CROSS-REFERENCE TO RELATED APPLICATIONS

This application claims the benefit of U.S. Provisional Application Ser. No. 62/566,001, filed Sep. 29, 2017, and entitled "LOGIC, COMPUTING AND MANAGEMENT APPLICATIONS FOR RESISTIVE MEMORY DEVICES", the entirety of which is expressly incorporated herein by reference.

TECHNICAL FIELD

This disclosure generally relates to resistive random access memory and more specifically to resistive random access memory matrix multiplication structures and methods.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

Over time, advancement in technology has provided an increase in a number of semiconductor devices, such as transistors, that can be fabricated on a given geometric area of a semiconductor chip. An implication of increasing the number of semiconductor devices is increasing memory capacity and processing power for the semiconductor chip and associated electronic devices.

Models for resistive-switching memory proposed by the inventor(s) utilize two-terminal structures. Two-terminal memory technology is contrasted, for instance, with gate-controlled transistors in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventor(s) of the present disclosure is further aware of a variety of two-terminal memory technologies, such as phase-change memory, magneto-resistive memory, conductive-bridging memory, as well as others.

While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

Drawing from existing research, the inventor(s) endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

An aspect relates to a non-volatile memory logic system that can comprise a bit line(s) and at a set of wordlines. Also included in the non-volatile memory logic system can be a set of resistive switching memory circuits at respective intersections between the bit line(s) and the set of wordlines. Resistive switching memory cells within the resistive switching memory circuits can be programmed with respective bit values corresponding to a first data matrix. A second data matrix, represented by a set of electrical currents input onto the wordlines, is then provided to the non-volatile memory logic system as a system input. The non-volatile memory logic system generates an output, on the bit line(s), in response to input of the second data matrix and the programming of the resistive switching memory cells to the first data matrix. In an embodiment, the output can be a dot product multiplication result of the first data matrix and the second data matrix.

According to an implementation, an output of the non-volatile memory logic system can be provided by an output current on a bit line(s) thereof. The output current on the bit line(s) can be a function of the electrical voltage or currents input on the set of wordlines and the resistive states (e.g., the first data matrix) of the set of resistive switching memory cells. In an embodiment, a wordline having a high logic value (e.g., high electrical voltage or current) and a resistive switching memory circuit having a high logic value (e.g., low resistance state) can generate a low resistance path to ground resulting in a current (or small range of current) on a bit line of the non-volatile memory logic system. Additional resistive switching memory circuits on the same bit line, if having the high logic value on the wordline and the high logic value programmed to the resistive switching memory circuit, can each generate additional low resistance paths to ground and therefore generate additional currents (or small ranges of the current) on the bit line, that are additive. A low logic value on a wordline, or a low logic value programmed to a resistive switching memory circuit, results in a high resistance path to ground on that wordline and therefore no or negligible additional current. By measuring a number of units of current on the bit line, a dot product of a first data matrix programmed to the resistive switching memory circuits and a second data matrix of the electrical currents on the wordline can be determined.

In accordance with an implementation, a first data matrix can be programmed to resistive switching memory circuits on one or more bit lines of a non-volatile memory logic system. This first data matrix can serve as a data filter (e.g., a dot product data filter or kernel), as one operational example. Different second data matrices can be applied to the set of wordlines to obtain different dot product results for the first data matrix. Thus, with a single programming operation setting the resistive switching memory circuits to the first data matrix, multiple dot product results of the first data matrix can be obtained, in relatively short time. For instance, inputting a sequence of different second data matrices on the set of wordlines and obtaining respective output currents on the bit line(s) after each such input can produce dot product results of the first data matrix with each of the sequence of different second data matrices.

In an implementation, a disclosed non-volatile memory logic system can comprise multiple bit lines intersecting the set of wordlines, with resistive switching memory circuits at each wordline-bit line intersection. Further to this implementation, the first data matrix programmed to the resistive switching memory circuits can be a two-dimensional matrix (e.g., an n×m data matrix where n and m are both positive numbers greater than 1). The second data matrix (e.g., a one-dimensional data matrix) input on the set of wordlines can be received at resistive switching memory circuits on each of the multiple bit lines, effecting a one-dimensional by two-dimensional dot product result, in various embodiments. In further embodiments, the first data matrix can emulate multi-bit numbers utilizing the two-dimensional matrix by multiplying current on a bit line by $2^n$, where n is a bit order associated with the bit line (e.g., $0^{th}$ order, first order, second order, and so on). Non-binary multi-bit numbers can be emulated by multiplying current on a bit line by $x^n$ (e.g., where x is equal to 10 for base order 10 numbers, and so forth).

In still further implementations, a disclosed non-volatile memory logic system can implement a dot product of a two-dimensional first data matrix with a two-dimensional second data matrix. A two-dimensional first data matrix can be programmed to the resistive switching memory circuits as described above. Further, input of a two-dimensional second data matrix can be emulated by inputting onto the wordlines (e.g., on different clock cycles) successive bit orders of the two-dimensional second data matrix (each successive bit order being a one-dimensional portion of the second data matrix), and multiplying successive bit order dot product results by their respective bit order (e.g., $2^n$ for a binary system, where n is the bit order). Results of successive one-dimension by two-dimension dot product operations (multiplied by their bit order) are then summed to generate a result of the dot product of the two-dimension first data matrix and the two-dimension second data matrix.

The following description and the drawings set forth certain illustrative aspects of the specification. These aspects are indicative, however, of but a few of the various ways in which the principles of the specification can be employed. Other advantages and novel features of the specification will become apparent from the following detailed description of the specification when considered in conjunction with the drawings.

BRIEF DESCRIPTION OF THE DRAWINGS

Numerous aspects, embodiments, objects, and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure can be practiced without these specific details, or with other methods, components, materials, etc. In other instances, well-known structures and devices are shown in block diagram form to facilitate describing the subject disclosure;

FIGS. 3A-3H illustrate example alternative implementations of a filter circuits comprising resistive memories according to an embodiment of the subject disclosure;

DETAILED DESCRIPTION

Introduction

Figure 1:
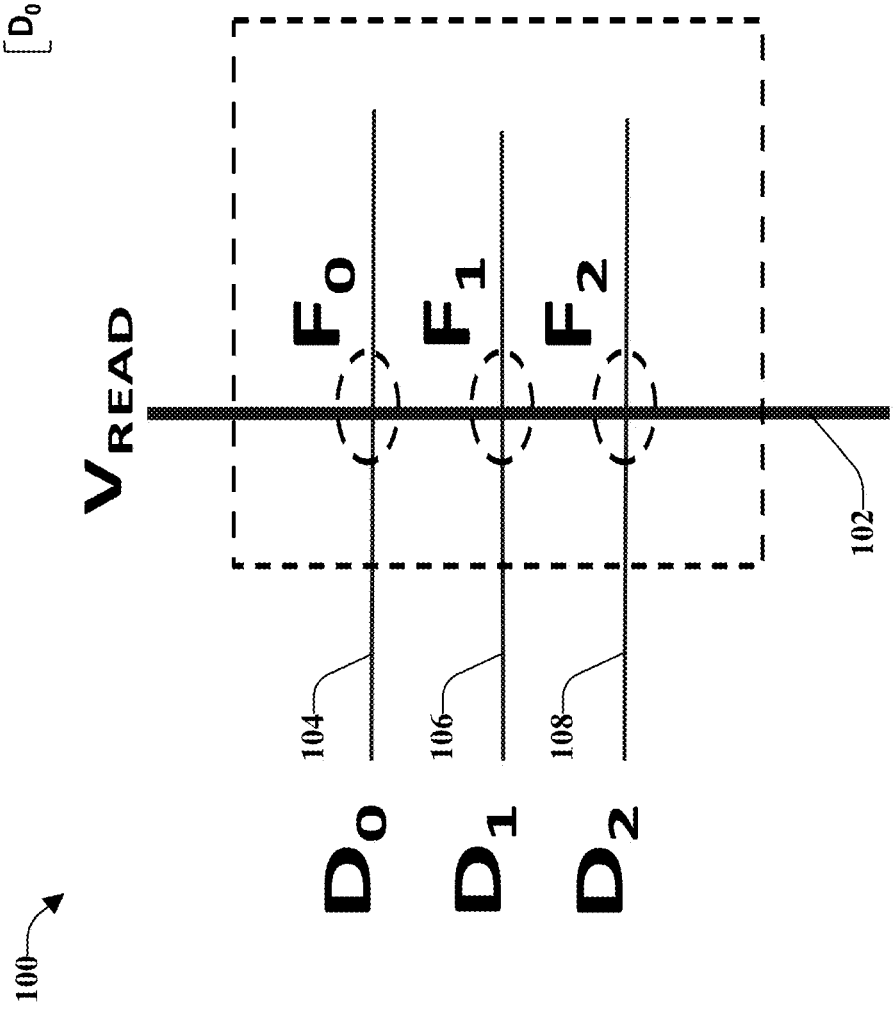
FIG. 1 illustrates a schematic diagram of an example circuit that can be utilized for matrix multiplication (e.g., dot product multiplication) according to an embodiment of the subject disclosure.

As its name implies, a two-terminal memory device has two terminals or electrodes. Herein, the terms "electrode" and "terminal" are used interchangeably. Generally, a first electrode of two-terminal memory is referred to as a "top electrode" (TE) and a second electrode of the two-terminal memory is referred to as a "bottom electrode" (BE), although it is understood that electrodes of a two-terminal memory device can be according to any suitable arrangement, including a horizontal arrangement in which components of a memory cell are (substantially) side-by-side rather than overlying one another and including an oblique arrangement in which a memory cell stack is constructed at non-right angles to an underlying substrate. Situated between the TE and BE of a two-terminal memory device is typically an interface layer sometimes referred to as a switching layer, a resistive switching medium (RSM) or a resistive switching layer (RSL). When incorporating a RSM, the two-terminal memory device can be referred to as a (two-terminal) resistive switching device. In at least some disclosed embodiments, a non-volatile resistive switching device can be provided as a data storage device, and a volatile resistive switching device can be provided in series with the non-volatile resistive switching device to serve as an access device (also referred to as a selector device) for the data storage device. In such embodiments, the access device can mitigate current leakage in a 1 transistor—many resistive memory cell (1 TnR) architecture, among other benefits.

One example of a resistive switching memory is a filamentary resistive memory cell. Composition of filamentary resistive memory cells, generally speaking, can vary per device with different components selected to achieve desired characteristics (e.g., volatility/non-volatility, on/off current ratio, switching time, read time, memory durability, program/erase cycle, and so on). One example of a filamentary resistive memory cell can comprise: a conductive layer, e.g., metal, metal-alloy (including, for instance, a metal-metal alloy such as TiW and others, and various suitable metal-nonmetal alloys), metal-nitride (e.g., comprising TiN, TaN, or other suitable metal-nitride compound), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.), a RSL and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, $Si_3N_4$, $SiN_x$ where x is a positive number, etc.), a Si sub-oxide (e.g., SiOx wherein x has a value between 0.1 and 2), a Si sub-nitride, a metal oxide, a metal nitride, a non-stoichiometric silicon compound, a silicon and nitrogen containing material, a metal and nitrogen containing material, and so forth. Other examples of amorphous and/or non-stoichiometric materials suitable for the RSL could include $Si_XGe_YO_Z$ (where X, Y and Z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) other suitable oxides and so forth, a nitride (e.g., AlN, SiN), e.g., or the like, or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The relatively large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Having few particle-trapping voids/defects, a conductive filament formed in the volatile RSL can be quite thin, and unstable absent a suitably high external stimulus (e.g., an electric field, voltage, current, joule heating, or a suitable combination thereof). Moreover, in the context of a volatile selector device, the neutral metal particles can be selected to have high surface energy, and good diffusivity within the volatile RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum(Ta), iron (Fe), manganese (Mn), tungsten (W), vanadium (V), cobalt (Co), platinum (Pt), hafnium (Hf), and palladium (Pd). Other suitable conductive materials, as well as compounds, oxides, nitrides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number 0<x<2, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: TiNx, TaNx, AlNx, CuNx, WNx and AgNx, where x is a positive number. In a further embodiment(s), the active metal layer can comprise a metal oxide selected from the group consisting of: TiOx, TaOx, AlOx, CuOx, WOx and AgOx. In yet another embodiment(s), the active metal layer can comprise a metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: MNx, e.g., AgNx, TiNx, AlNx, etc., and the resistive switching layer comprises a metal nitride: MNy, e.g., AgOy, TiOy, AlOy, and so forth, where y and x are positive numbers, and in some cases y is larger than x. In an alternative embodiment of this example, the particle donor layer comprises a metal oxide: MOx, e.g., AgOx, TiOx, AlOx, and so on, and the resistive switching layer comprises a metal oxide: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOx, TiOx, AlOx, etc.) and SiOy, where x and y are typically non-stoichiometric values.

As utilized herein, variables x, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure similar to the foregoing example(s) can be found in the following U.S. patent applications that are licensed to the assignee of the present application for patent: application Ser. No. 13/875,541 filed Oct. 19, 2007 and application Ser. No. 12/575,921 filed Oct. 8, 2009; each of the foregoing patent applications are hereby incorporated by reference herein in their respective entireties and for all purposes.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., $I_{on}$) can be indicative of the conductive state of the two-terminal memory cell. For example, when the conductive filament has been formed (e.g., in response to application of a program pulse), the conductance of the cell is greater than otherwise and the measured current (e.g., $I_{on}$) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., $I_{off}$) reading in response to the read pulse will be lower. By convention, when the conductive filament is formed, the memory cell is said to be in the "on-state" with a high conductance. When the conductive filament is not extant, the memory cell is said to be in the "off-state." A memory cell being in the on-state or the off-state can be logically mapped to binary values such as, e.g., "1" and "0." It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

Example Resistive Random Access Memory Matrix Multiplication Structures

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure can be practiced without these specific details, or with other methods, components, materials, etc. In other instances, well-known structures and devices are shown in block diagram form to facilitate describing the subject disclosure.

Referring initially to FIG. 1, illustrated is a schematic diagram of an example circuit 100 that can be utilized for matrix multiplication (e.g., dot product multiplication) according to an embodiment of the subject disclosure. Matrix multiplication (or a matrix product) is an operation that produces a product data matrix from two data matrices. A dot product (also called a scalar product) is an operation that takes two equal-length sequences of numbers and returns a single number. Electronic circuits that implement matrix multiplication operations can be implemented in part with non-volatile resistive memory circuits as will be discussed herein. Various embodiments of disclosed resistive memory circuits provide dot product accelerators that have low power consumption, high processing speed, small chip density, and low fabrication cost.

For purposes of discussion, a first data matrix is represented by a sequence of data bits programmed to a set of resistive memory circuits, and a second data matrix is represented by electrical inputs to the resistive memory circuits. In various embodiments, the electrical inputs can include, e.g., a binary input represented by a logical high input signal or logical low input signal. The binary (electrical) input can be embodied by an electrical current, a voltage, an electric field, or other suitable electrical input, or suitable combinations of the foregoing, in various embodiments.

The example circuit 100 can be utilized for a 1×3 matrix to 3×1 matrix multiplication with each data and filter having a binary value (0 or 1). Therefore, the first data matrix can include data bits programmed to a set of resistive memory circuits (also referred to as input data)

$$\begin{bmatrix} F_0 \\ F_1 \\ F_2 \end{bmatrix}$$

(e.g., a set of filters F) and the second data matrix can include electrical inputs to the resistive memory circuits (also referred to as activation data bits) $[D_0\ D_1\ D_2]$ (e.g., a set of data).

The example circuit 100 can include a bit line 102 and multiple wordlines, illustrated as a first wordline 104, a second wordline 106, and a third wordline 108. At the intersections of the bit line and the multiple wordlines are respective resistive memory circuits, represented by the dashed circles. The resistive memory circuits can be programmed to store a first matrix of data bits, also referred to as a data filter(s) F. These resistive memory circuits can be reprogrammed to store different matrixes of data bits, by applying suitable program (or erase) signals at the respective intersections. Further details related to the components resistive memory circuits (also referred to herein as filters, or filter circuits) will be provided below.

As mentioned, the filter circuits can be populated (or programmed) with respective input data bits of the first input matrix. For example, a first filter circuit at the intersection of the bit line 102 and the first wordline 104 can be programmed with a first input data $F_0$ of the first data matrix. In the binary context, $F_0$ can thus be programmed to a 0 or a 1, though non-binary systems can be implemented within the scope of the present disclosure as well. A second filter circuit at the intersection of the bit line 102 and the second wordline 106 can be programmed with a second input data $F_1$ of the first data matrix. Further, a third filter circuit at the intersection of the bit line 102 and the third wordline 108 can be programmed with a third input data $F_2$ of the first data matrix. As a particular example, the data matrix: 1 0 1 can be programmed to the filters of FIG. 1 by programming $F_0$ to 1, $F_1$ to 0 and $F_2$ to 1. Since the input data $F_0$, $F_1$, and $F_2$ are programmed into the filter, the values of the filters (kernels) do not change (e.g., remain static) until a subsequent programming operation is performed to re-program the filters.

Input voltage or current at the wordlines can include respective activation bit values of the second data matrix. Thus, the first wordline 104 can receive a first activation data $D_0$ of the second data matrix. The second wordline 106 can receive a second activation data $D_1$ of the second data matrix. Further, the third wordline 108 can receive a third activation data $D_2$ of the second data matrix. As another particular example, to input a second data matrix: 0 0 1, a high signal is provided for the first activation data on $D_0$, a low signal is provided for the second activation data on $D_1$, and a low signal is provided for the third activation data on $D_2$.

A 1×3 to 3×1 matrix multiplication can be applied to the example circuit 100 according to the following equation, $$[D_0 D_1 D_2] \times \begin{bmatrix} F_0 \\ F_1 \\ F_2 \end{bmatrix} = D_0 \times F_0 + D_1 \times F_1 + D_2 \times F_2. \quad \text{Equation 1}$$

For purposes of describing the various aspects, a resistive memory circuit programmed to a value of "1" indicates a non-volatile resistive memory cell in a low resistance state (LRS), and a resistive memory circuit programmed to a value of "0" indicates a non-volatile resistive memory cell in a high resistance state (HRS). A read voltage $V_{READ}$ is applied to bit line 102 in conjunction with generating a matrix multiplication output for the 1'3 matrix multiplication implemented by FIG. 1. Respective resistive memory circuits at each of the filters $F_0$, $F_1$, $F_2$ can be configured to provide a low resistance path to ground, generating a unit electrical current in response to $V_{READ}$ on bit line 102, if programmed to an input value of "1" and in response to an activation value of "1." Filters F0, F1, F2 result in a high resistance path to ground if programmed to an input value of "0" or in response to an activation value of "0," generating no significant electrical current on bit line 102.

As a particular example, if a value of an input data is "0" or a value of an activation data is "0," on a particular wordline, contribution of current on bit line 102 provided by that particular wordline is "0." As another example, if the value of activation data $D_0$ is "0" and the value of input data $F_0$ is "1," the contribution of current value on bit line 102 associated with first wordline 104 is "0." As an additional example, if the value of activation data $D_0$ is "1" and the value of input data $F_0$ is "0," the contribution of current on bit line 102 associated with wordline 104 is likewise "0." In a further example, if the value of activation data $D_0$ is "1" and the value of input data $F_0$ is "1," then a contribution of current on bit line 102 associated with wordline 104 is "1 unit," and similarly for wordlines 106 and 108. Where multiple wordlines 104, 106, 108 have input data bits programmed to "1" and receive activation values of "1", multiple (additive) instances of the unit electrical current will be measured on bit line 102. Thus, by applying Equation 1, and measuring current on bit line 102, a dot product output of the 1×3 matrix with a 3×1 can be acquired. It is noted that "0" current is current that does not significantly contribute current to the bit line and, as such, does not effect the additive current.

Figure 2:
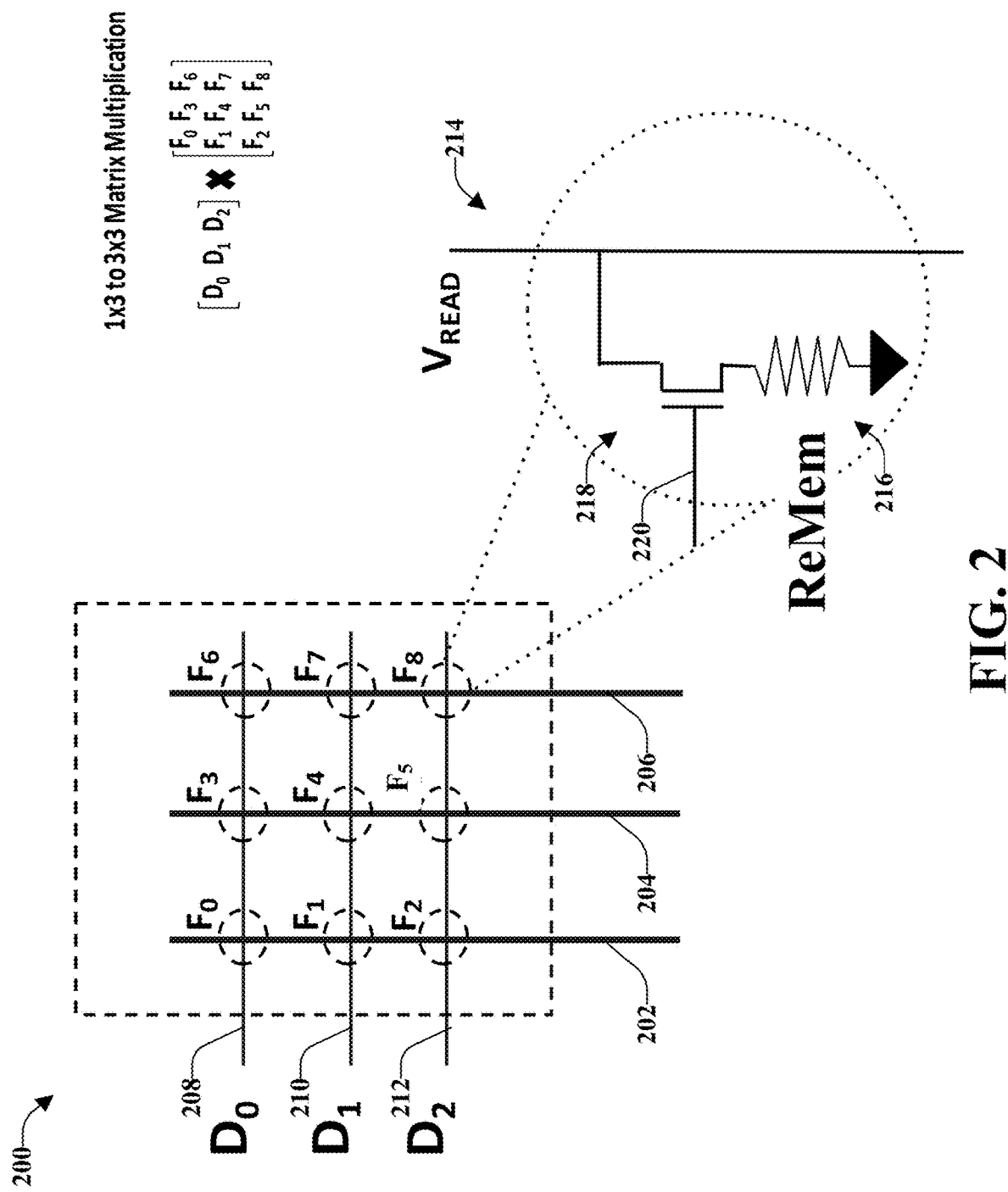
FIG. 2 illustrates a schematic diagram of an example circuit representing a 3×1 matrix with 3×3 matrix multiplication according to an embodiment of the subject disclosure.

FIG. 2 illustrates a schematic diagram of an example circuit 200 representing a 3×1 matrix with 3×3 matrix multiplication according to an embodiment of the subject disclosure. The example circuit 200 includes three bit lines, illustrated as a first bit line 202, a second bit line 204, and a third bit line 206. Also included in the example circuit 200 are three wordlines, illustrated as a first wordline 208, a second wordline 210, and a third wordline 212.

For the 3×1 to 3×3 matrix multiplication, a first input data matrix can include input data bits $$\begin{bmatrix} F_0 & F_3 & F_6 \\ F_1 & F_4 & F_7 \\ F_2 & F_5 & F_8 \end{bmatrix},$$

and a second data matrix can include activation data bits $[D_0\ D_1\ D_2]$. In this case, the matrix multiplication can be expressed as:

$$[D_0 D_1 D_2] \times \begin{bmatrix} F_0 & F_3 & F_6 \\ F_1 & F_4 & F_7 \\ F_2 & F_5 & F_8 \end{bmatrix} \quad \text{Equation 2}$$

Similar to FIG. 1, the filters F can be programmed with respective input data of the first data matrix. For example, a first filter circuit at the intersection of the first bit line 202 and the first wordline 208 can be programmed with a first input data $F_0$ of the first data matrix. A second filter circuit at the intersection of the first bit line 202 and the second wordline 210 can be programmed with a second input data $F_1$ of the first data matrix. A third filter circuit at the intersection of the first bit line 202 and the third wordline 212 can be programmed with a third input data $F_2$ of the first data matrix.

In a similar manner, a fourth filter circuit at the intersection of the second bit line 204 and the first wordline 208 can be programmed with a fourth input data $F_3$ of the first data matrix. A fifth filter circuit at the intersection of the second bit line 204 and the second wordline 210 can be programmed with a fifth input data $F_4$ of the first data matrix. A sixth filter circuit at the intersection of the second bit line 204 and the third wordline 212 can be programmed with a sixth input data $F_5$ of the first data matrix.

Further, a seventh filter circuit at the intersection of the third bit line 206 and the first wordline 208 can be programmed with a seventh input data bit $F_6$ of the first data matrix. An eighth filter circuit at the intersection n of the third bit line 206 and the second wordline 210 can be programmed with an eighth input data bit $F_7$ of the first data matrix. A ninth filter circuit at the intersection of the third bit line 206 and the third wordline 212 can be programmed with a ninth input data bit $F_8$ of the first data matrix.

Since the input data bits $F_0$, $F_1$, $F_2$, $F_3$, $F_4$, $F_5$, $F_6$, $F_7$, and $F_8$ are programmed into non-volatile resistive memory cells of the filters (e.g., see resistive memory 216, or FIG. 3B, discussed below), the values of F (kernels) do not change (e.g., remain static) until a subsequent programming operation is performed (e.g., a new input data matrix is programmed into the filters). Accordingly, the filter F can be programmed and data D can be changed and results can be obtained based on the value of the filter F and the value of the data D.

As mentioned, the intersection of the wordlines and bit lines can include respective non-volatile resistive memory cells, which can be connected within the memory array in different manners. For example, the circled area at the intersection of the third bit line 206 and the third wordline 212 is illustrated in an exploded view of a filter circuit 214. As illustrated, the resistive memory 216 can be connected to a transistor 218. In this example implementation, the activation value D enters a gate 220 of the transistor 218. Thus, if the ninth input data $F_8$ is "1" (e.g., resistive memory 216 is in a low resistance state) and the third activation $D_2$ is "1," (transistor 218 is activated), filter $F_8$ provides a low resistance path to ground, and draws a unit electrical current in response to $V_{READ}$ on third bit line 206. If the ninth input data $F_8$ is "0" (e.g., resistive memory 216 is in a high resistance state), although the gate 220 is high and therefore transistor 218 is activated, the current through the resistive memory 216 will be negligible (e.g., there will be little, if any current flowing through the third bit line 206). For current to be contributing (e.g., sinking) on a bit line, both the respective input data bits and the respective activation data bits should have values of "1." Thus, if all the activation data bits on the wordlines have a value of "1" and all the input data programmed on a word line have a value of "1," there will be three unit electrical currents contributing to a current measured on the third bit line 206. Therefore, the sum of the bit line is a combination of three current paths flowing through the bit line (Equation 1).

Figure 3B:
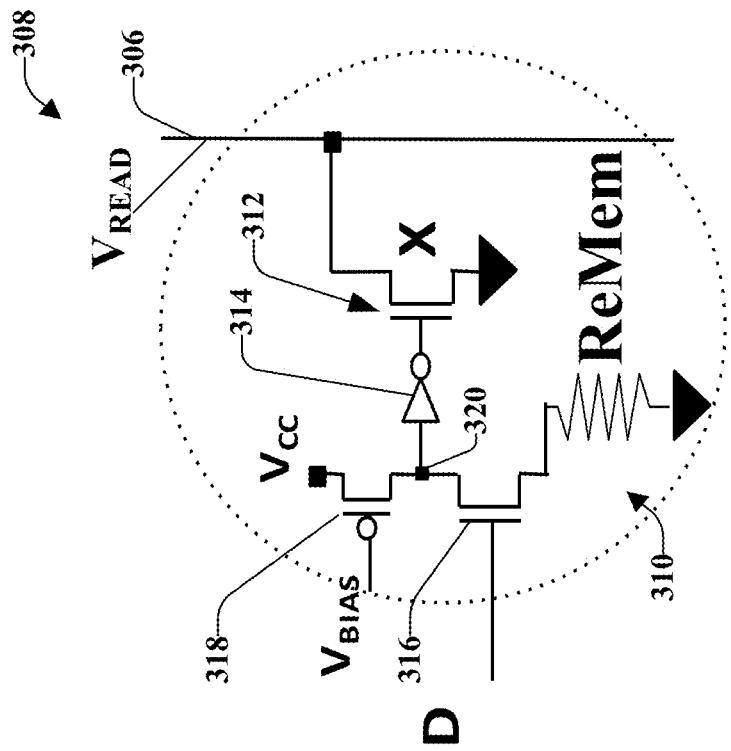
Figure 3A:
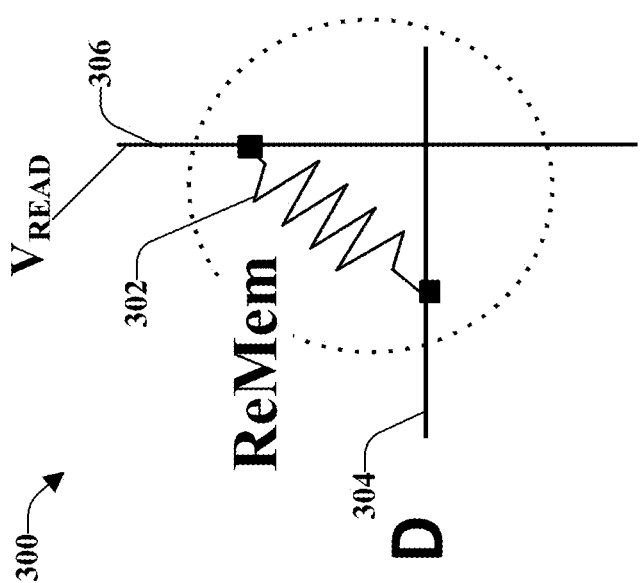

FIG. 3A illustrates an alternative implementation of a filter circuit 300 comprising a resistive memory according to an embodiment of the subject disclosure. In this embodiment, the filter circuit 300 includes a resistive memory 302 that is implemented as a single resistor that has a first end connected to the wordline D 304 and a second end connected to the bit line 306. The resistive memory implementation of FIG. 3A has a small size in terms of physical area used, since only a single two-terminal resistive memory cell is included in the circuit. However, the example embodiment of FIG. 3A can have a large amount of current leakage, and thus variability in current on bit line 306, since all the resistors (where multiple filter circuits 300 are deployed on a bit line 306) are always selected and all the resistors contribute (sink) current even when the value of "D" (the wordline) is "1." The value of the resistor and its distribution should be selected to correct detection of the sum on a bit line.

FIG. 3B illustrates another example alternative embodiment of a filter circuit 308 comprising a resistive memory 310 according to an embodiment of the subject disclosure. The filter circuit 308 includes the resistive memory 310, a first NMOS transistor X 312, an inverter 314, a second NMOS transistor 316, and a PMOS transistor 318. The first NMOS transistor X 312 is either "ON" or "OFF" with no resistor in the path. With $V_{BIAS}$ low, PMOS transistor 318 is activated and provides $V_{CC}$ to the common node 320 shared by inverter 314, PMOS transistor 318 and second NMOS transistor 316. If second NMOS transistor 316 is deactivated (e.g., D has a low input) or if resistive memory 310 stores a "0" (e.g., has a high resistance state), common node 320 is effectively isolated from ground and $V_{CC}$ appears at an input of inverter 314, which outputs a low signal (e.g., "0") to a gate of first NMOS transistor 312. In such condition, first NMOS transistor 312 is deactivated and does not provide a low resistance path to ground, thereby drawing no significant current on bit line 306. Conversely, if both D is high (activating second NMOS transistor 316) and resistive memory 310 stores a "1" (has a low resistance state), common node 320 is connected to ground, and thus inverter 314 outputs a high signal (e.g., "1") to the gate of first NMOS transistor 312. In this state, first NMOS transistor 312 is activated providing a low resistance path to ground, and a current will be drawn on bit line 306 in response to $V_{READ}$.

In an alternate implementation, the inverter 314 can be removed and, thus, the circuit will sink current when dot product is "0." First NMOS 312 can have very high uniformity in both the low resistance state and high resistance state, substantially reducing variability of unit electrical current on bit line 306, enabling accurate as well as larger numbers of filter circuits 308 on a single bit line 306 without losing the ability to differentiate among proper dot product output values. Filter circuit 308 takes up more area on a chip given the larger number of components (e.g., transistors), compared with other filter circuits described herein.

As compared to the filter circuit 300 of FIG. 3A and filter circuit 308 of FIG. 3B, the filter circuit 214 of FIG. 2 is in the middle in terms of size (e.g., one two-terminal non-volatile resistive memory cell, and one transistor). Further, the filter circuit 214 of FIG. 2 is in the middle in terms of current variability since the transistor is off when D is "0." When D is "1," then variability among resistive memory cells on a single bit line 306 can affect the variability of current measured on the bit line 306, which in turn can limit a number of filter circuits 214 per bit line 306.

Illustrated in FIGS. 3C-3H are a voltage divider 322 that comprises two resistive switching memory elements, namely, a first or top resistive switching memory element and a second or bottom resistive switching memory element. Also included is a common node 324 between the two resistive switching memory elements. A bit line is illustrated at 326, and a transistor connected to each bit line 326 (e.g., see transistor x 312 of FIG. 3B) can be sized based on a multiplication ratio needed for the given bit line 326 (e.g., matching a position of the bit line 326 in a matrix multiplication array).

In the implementation of FIG. 3C, the common node 324 serves as an output to a transistor element 326. Further to this implementation, the first resistive switching memory element is F, and the second resistive switching memory element is F bar. Thus, two states are represented. A first state is a condition represented by F having a high resistance and F bar having a low resistance. In the first state, Vcc is applied and there is voltage (or negligible voltage) at the common node 324. Therefore, voltage does not appear at the gate of the transistor element 326. A second state is a condition represented by F having a low resistance and F bar having a high resistance. In the second state, Vcc is applied and voltage will appear at the common node 324. Thus, voltage appears at the gate of the transistor element 326. As illustrated, D is connected to the source of the transistor element 326 for the implementation of the first circuit ("1").

In the circuit of FIG. 3D, the top or first resistive switching memory element is F bar and the bottom or second resistive switching memory element is F. Similar to the first circuit, when the first resistive switching memory element (e.g., F bar) has high resistance and the second first resistive switching memory element (e.g., F) has low resistance, there is no (or minimal) voltage at the common node 324. However, when the first resistive switching memory element has low resistance and the second first resistive switching memory element has high resistance, there is voltage applied at the common node 324. In the embodiment of the second circuit, the common node 324 is a source input of the transistor element 326 and D controls the gate of the transistor element 326.

The circuit of FIG. 3E comprises the voltage divider 322 and a common node 324, which represents the output of the voltage divider 322. Also included in this embodiment is a latch 328 and a latch enable transistor 330. The output value of the voltage divider 322 is loaded to the latch 328. Then, the latch enable transistor 330 is deactivated (e.g., turned off) so that Vcc can be turned off. In this manner, the voltage divider 322 does not require continuous power due to the operation of the latch 328 and the latch enable transistor 330. Thereafter, the third circuit operates the same as the second circuit. Thus, the difference between the second circuit and the third circuit is the third circuit traps the output value of the voltage divider 322 so that the Vcc can be turned off at the voltage divider 322.

Figure 3H:
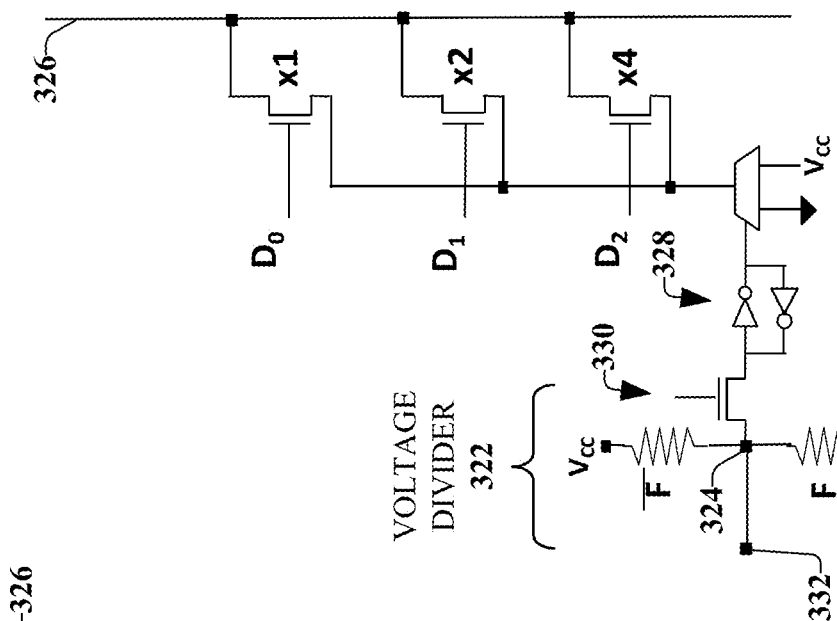
Figure 3G:
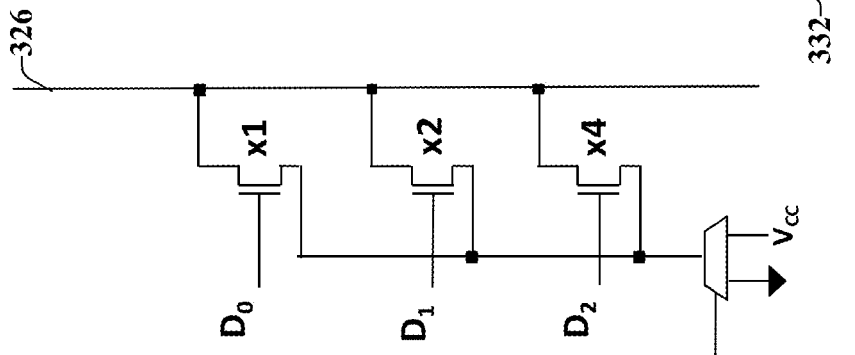
Figure 3F:
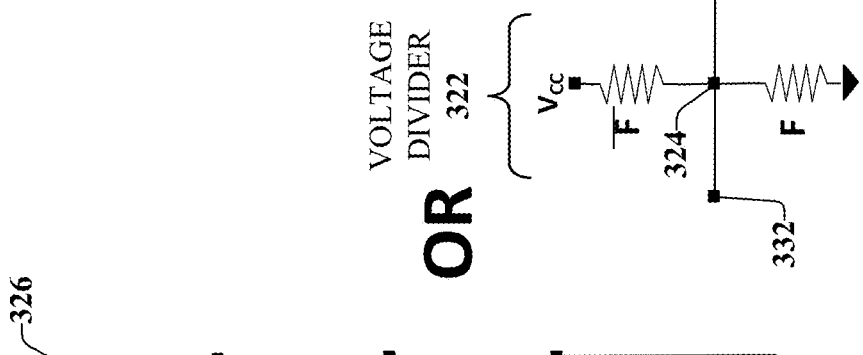

For FIGS. 3F, 3G and 3H, resistance values for transistors x1, x2 and x4 are selected to achieve desired current outputs on $D_0$, $D_1$ and $D_2$. As one example, resistance of x4 transistor $R_{x4}$ can be four times the resistance of x1 transistor $R_{x1}$, whereas resistance of x2 transistor $R_{x2}$ can be twice $R_{x1}$. However this example is in no way limiting and other relative strengths of transistors x1, x2 and x4 can be provided depending on design choice. The circuit of FIG. 3F is a multi-bit version that operates similar to the single bit version of the circuit of FIG. 3C. The circuit of FIG. 3G is a multi-bit version that operates similar to the single bit version of the circuit of FIG. 3D. Further, the circuit of FIG. 3H is a multi-bit version that operates similar to the single bit version of the circuit of FIG. 3E.

Also illustrated are respective program/erase inputs 332. In an example, for programming, a program input can be provided to the common node 324 of the voltage divider 322. According to some implementations, ground or Vcc could be changed to a suitable program or erase voltage in conjunction with the program input as needed to program or erase the first resistive memory or the second resistive memory.

Figure 4:
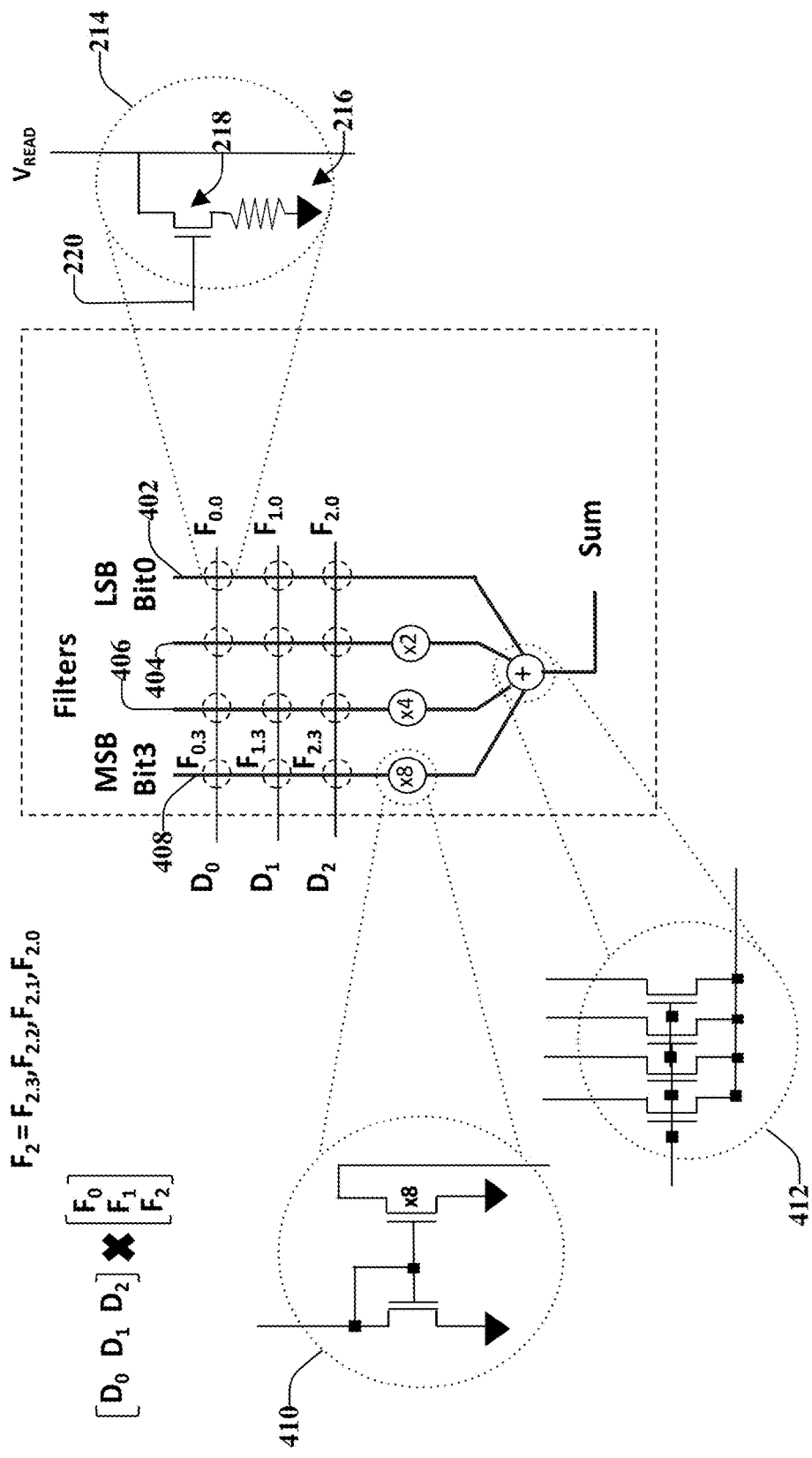
FIG. 4 illustrates an example, non-limiting circuit for implementation of a 1×3 to 3×1 matrix multiplication according to an embodiment of the subject disclosure.

FIG. 4 illustrates an example, non-limiting circuit 400 for implementation of a 1×3 to 3×1 matrix multiplication according to an embodiment of the subject disclosure. In this implementation, each filter F is four bits (and four filter circuits) and each data D is one bit. Current amplifier circuits 410 are provided to model higher order bit numbers (in a binary system for this example, where current amplification is $2^n$ and n is the bit order ($0^{th}$ order bit, $1^{st}$ order bit, $2^{nd}$ or order bit, $3^{rd}$ order bit)). Circuit 400 can be modified, as would be understood in the art, to model different sized matrixes as well as different numbers of bits. Thus, the following matrix multiplier applies.

$$[D_0 D_1 D_2] \times \begin{bmatrix} F_0 \\ F_1 \\ F_2 \end{bmatrix}. \qquad \text{Equation 3}$$

In the preceding figures, the data D was a single bit and the filter F was a single bit. In the implementation of FIG. 4, the data D is one bit, but the filter F is four bits. Thus, $F_0 = F_{0.3}, F_{0.2}, F_{0.1}, F_{0.0}$, where 0.3, 0.2, 0.1, and 0.0 represent the third order, second order, first order, and zero order bits of F0, respectively. In a similar manner, $F_1 = F_{1.3}, F_{1.2}, F_{1.1}, F_{1.0}$ and $F_2 = F_{2.3}, F_{2.2}, F_{2.1}, F_{2.0}$.

Illustrated are four bit lines, namely, a first bit line 402, a second bit line 404, a third bit line 406, and a fourth bit line

408. The first bit line 402 can include the least significant bit (LSB) or Bit 0 (e.g., $F_{0.0}$, $F_{1.0}$, and $F_{2.0}$). The second bit line 404 can include the second LSB or Bit 1 (e.g., $F_{0.1}$, $F_{1.1}$, and $F_{2.1}$). The third bit line 404 can include the second most significant bit (MSB) or Bit 2 (e.g., $F_{0.2}$, $F_{1.2}$, and $F_{2.2}$). Further, the fourth bit line 408 can include the MSB or Bit 3 ($F_{0.3}$, $F_{1.3}$, and $F_{2.3}$).

In response to activation bit values $D_0$, $D_1$, and $D_2$ being input on wordline 220, current drawn on the first bit line 402 is provided to a summing circuit 412 to obtain the LSB value (e.g., the multiplier is 1). Note that the output of circuit 400 in FIG. 4 is the output of summing circuit 412. Current on the second bit line 404 in response to input of the activation bit values is provided to a ×2 current multiplication circuit (e.g., a ×2 current mirror, or the like) to emulate a relative value of the second LSB. The ×2 multiplication circuit therefore multiplies the current on bit line 404 by a factor of two, to obtain the second LSB value. The second LSB value is also provided to summing circuit 412. Similarly, current on the third bit line 406 is provided to a ×4 current multiplication circuit, the output of which is received at summing circuit 412 (the second MSB value), and current on the fourth bit line 408 is input to a ×8 current multiplication circuit (emulating a $3^{rd}$ order binary bit), which outputs the MSB to summing circuit 412. An exploded view of an example current mirror ×8 is illustrated at 410, although other suitable current multiplication circuits can be utilized as alternatives. Further, another manner of deriving the bit order multiplier can be utilized instead of a current multiplier, according to some implementations (e.g., $2^n$ bit lines and filter circuits per bit order, that are pre-summed before being received at summing circuit 412, as one example).

The sum of the LSB, second LSB (the output of the ×2 current multiplication circuit), the second MSB (the output of the ×4 current multiplication circuit), and the MSB (the output of the ×8 current multiplication circuit) are added by the summing circuit 412 to derive the dot product result of the matrix of equation 3, supra. However, it is noted that other suitable adders (e.g., digital adder, analog adder, etc.) can be utilized and the adder at 412 is illustrated for example purposes only.

Figure 5:
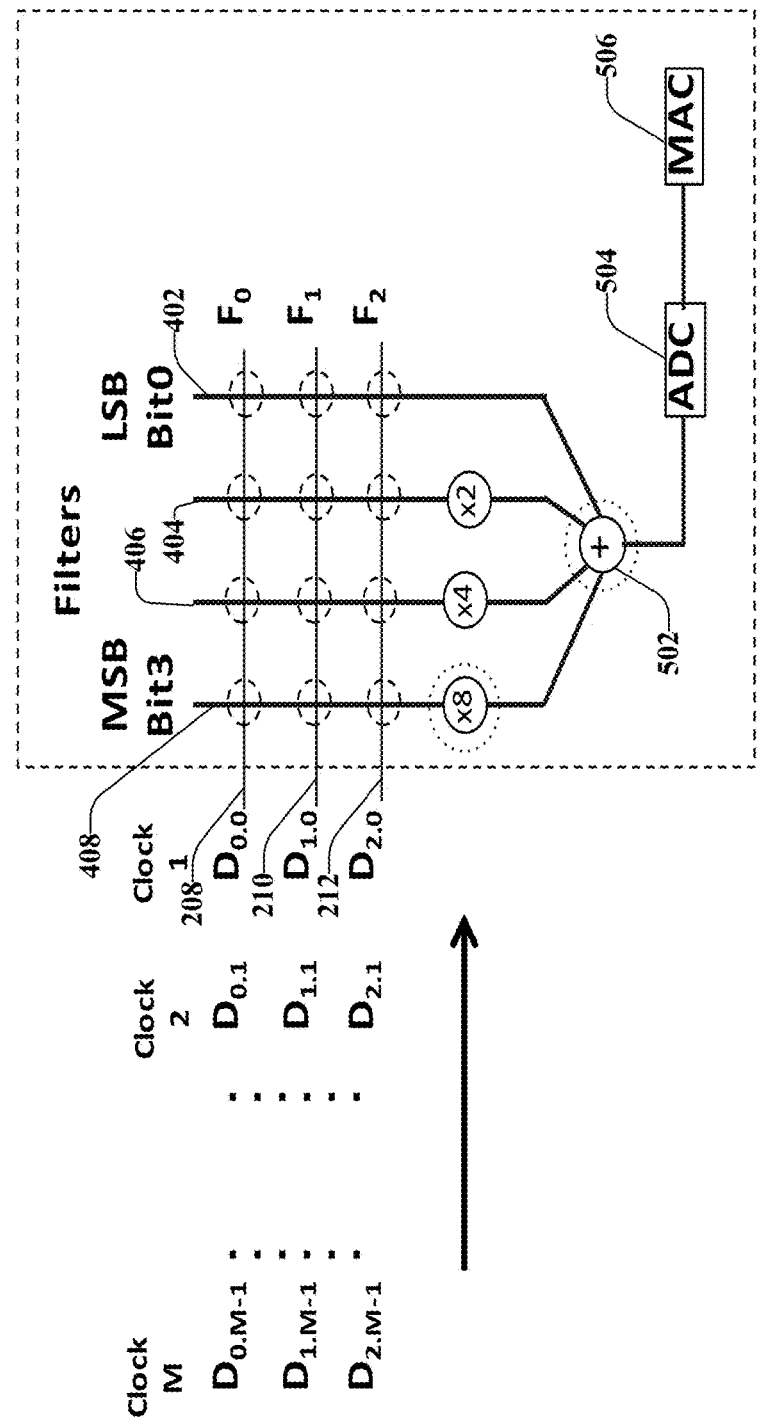
FIG. 5 illustrates another example, non-limiting circuit for implementation of a matrix multiplication according to an embodiment of the subject disclosure.

FIG. 5 illustrates another example, non-limiting circuit 500 for implementation of a matrix multiplication according to an embodiment of the subject disclosure. In this implementation, the matrix multiplication is a 1×3 (D) to 3×1 (F) matrix multiplication, with F being 4 bits wide and D being M bits wide, which can include any number of bits (e.g., 8 bits, 16 bits, 32 bits, and so on).

As illustrated, the circuit 500 can be similar to the circuit 400 of FIG. 4. Respective input filter bits F can include four bits, denoted, for example, as $F_2 = F_{2.3}$, $F_{2.2}$, $F_{2.1}$, $F_{2.0}$. In a similar manner, $F_1 = F_{1.3}$, $F_{1.2}$, $F_{1.1}$, $F_{1.0}$ and $F_0 = F_{0.3}$, $F_{0.2}$, $F_{0.1}$, $F_{0.0}$. The input data bits can be denoted as $D_0 = D_{0.M-1}$, $D_{0.M-2}$, ..., $D_{0.1}$, $D_{0.0}$. Thus, the following matrix multiplier applies:

$$[D_0 D_1 D_2] \oplus \begin{bmatrix} F_0 \\ F_1 \\ F_2 \end{bmatrix}. \quad \text{Equation 4}$$

In the example illustrated in FIG. 5, data D comprises 8 bits (e.g., M equals 8 in this example). During implementation, at each clock cycle, the D bits are received at each bit line. Thus, during a first clock cycle (clock 1), filter circuits on bit lines 402, 404, 406, and 408 receive the $D_{x.0}$ bits concurrently. The respective bit line current outputs from the filter circuits are multiplied (×8, ×4, ×2, ×1, respectively) to emulate the respective bit orders and are then summed at a summing circuit 502. The output of the summing circuit 502 is converted to digital form at an analog to digital converter (ADC) 504, and stored in MAC 206 during the first clock cycle. Thus, the entire 4-bit filter circuit for the $D_{x.0}$ bits is activated concurrently, producing a dot product output for the first D bit ($D_{x.0}$) for all 4 F bits on the first clock cycle.

During a second clock cycle (Clock 2), the $D_{x.1}$ bits are input to all bit lines and all bit lines output their current to the multipliers and are multiplied (×8, ×4, ×2, ×1, respectively) to emulate their respective bit orders. These value are then summed at the summing circuit 502 and converted to digital form at the ADC 504. This is, again, performed concurrently in order to generate a second dot product output for the second D bit (again for all 4 F bits) on the second clock cycle. The MAC 206 can multiply the output of the ADC 504 by two (×2) and can add the result to the previously stored value.

This process is repeated on subsequent clock cycles up to M clock cycles for the M-1th D bit. An accumulator MAC 506 (e.g., through a multiply accumulate (MAC) operation) multiples the result of the 4 F bit calculation by (2Clock_Cycle−1) and adds it to the previously stored value in the MAC 206 at the end of each clock cycle. Thus, at the end of M clock cycles the MAC 506 has added up the entire result of the M bit ×4 bit dot product. It is noted that the accumulator 506** is set to zero prior to implementation of the multiplication operation.

Figure 6:
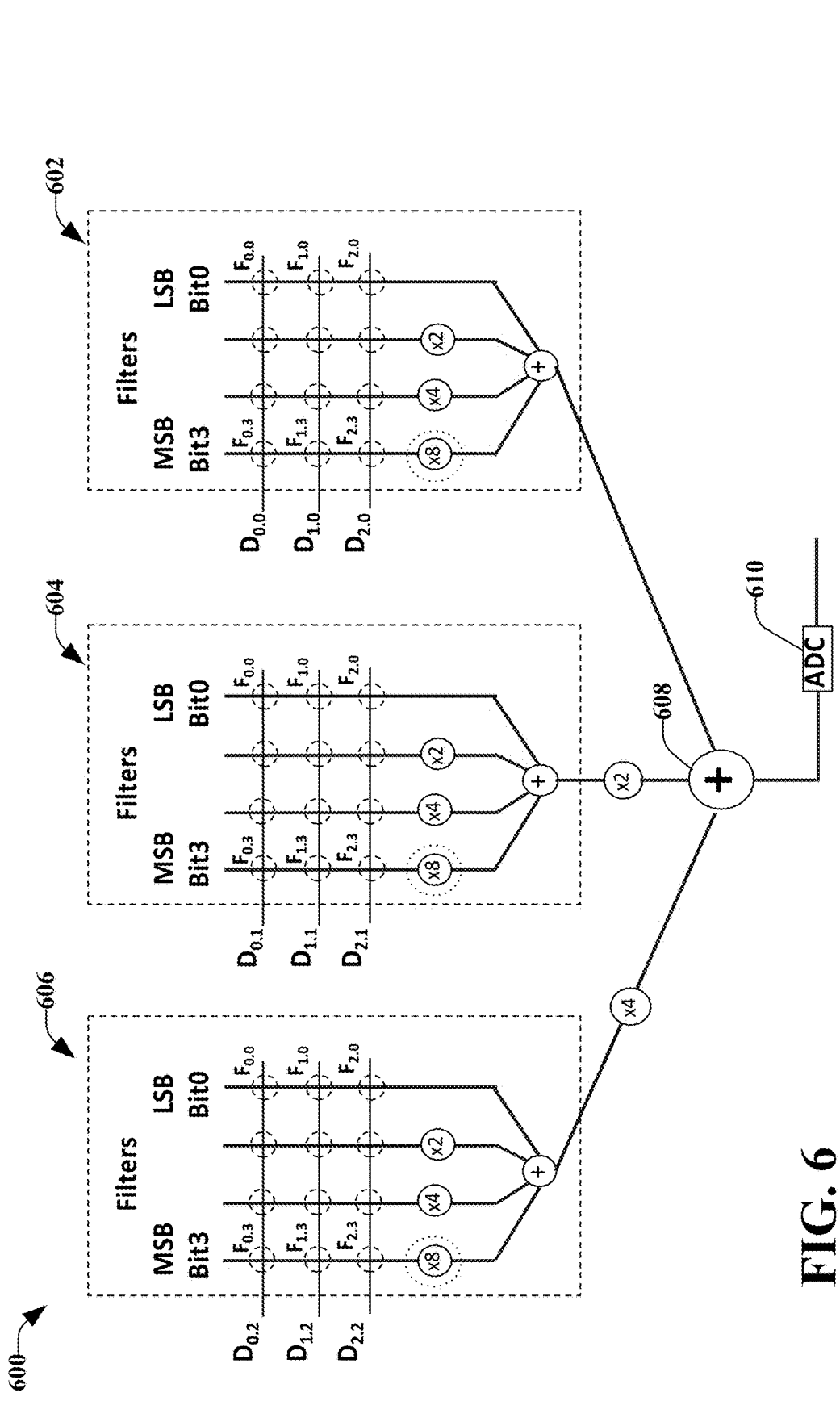
FIG. 6 illustrates another example, non-limiting example of another circuit that can be utilized for matrix multiplication according to an embodiment of the subject disclosure.

FIG. 6 illustrates another example, non-limiting example of another circuit 600 that can be utilized for matrix multiplication according to an embodiment of the subject disclosure. The matrix multiplication is a 1×3 to 3×1 in this example and the filter F comprises four bits; the data D comprises three bits (e.g., M=3 if continuing the example provided in FIG. 5, supra). The example of FIG. 6 illustrates the example matrix multiplication using separate hardware circuits for each of the D bits, instead of shifting data one bit at a time into a single such hardware circuit M times and multiplying and adding results with MAC 506, as discussed with respect to the circuit 500 of FIG. 5.

As illustrated, the circuit 600 comprises the circuit 500 of FIG. 5 duplicated three times (one time for each data D bit), illustrated as a first matrix multiplication circuit 602, a second matrix multiplication circuit 604, and a third matrix multiplication circuit 606. Thus, instead of inputting subsequent D-bits on different clock cycles into the same set of filter circuits, as discussed with respect to FIG. 5, three sets of filter circuits (or, for example, M sets of filter circuits, where D comprises another number M) are utilized in accordance with the implementation of FIG. 6. The operation of the first circuit 602, the second circuit 604, and the third circuit 606 is similar to the circuit 500 of FIG. 5. The following equation can be utilized with this implementation.

$$[D_{0.2}, D_{0.1}, D_{0.0} D_{1.2}, D_{1.1}, D_{1.0} D_{2.2}, D_{2.1}, D_{2.0}] \times \begin{bmatrix} F_{0.3}, F_{0.2}, F_{0.1}, F_{0.0} \\ F_{1.3}, F_{1.2}, F_{1.1}, F_{1.0} \\ F_{2.3}, F_{2.2}, F_{2.1}, F_{2.0} \end{bmatrix}. \quad \text{Equation 5}$$

Emulation of higher order F bits is achieved by the ×2, ×4, ×8 multipliers described above with respect to circuit 500, supra. Likewise, emulation of bit order for the D bits is achieved by multiplying output of first circuit 602×1 (the LSB for the D bits), multiplying output of second circuit 604×2 (the second LSB for the D bits), and multiplying output of third circuit 606×4 (the MSB for the D bits). Stated differently, an output of the first circuit 602 can be applied at a summing circuit 608 without a multiplier to obtain the LSB value (e.g., the multiplier is 1) for the D bits. The LSB value is provided to a summing circuit 608. A second output of the second circuit 604 can be provided to an ×2 current multiplication circuit to obtain the second LSB value for the D bits. The second LSB value is provided to the summing circuit 608. Further, a third output of the third circuit 606 can be provided to an ×4 current multiplication circuit, to obtain the MSB value for the D bits. The MSB value is also provided to the summing circuit 608. To reiterate, the multipliers (e.g., ×1, ×2, ×4) can be determined based on the respective bit orders of the D bits associated with respective matrix multiplication circuits 602, 604, 606. First circuit 602 has is associated with zero order D bits, the second filter or second circuit 604 is associated with first order D bits, and the third filter or third circuit 606 is associated with second order D bits. As indicated, the operations can be performed in analog and then can be converted to digital by an ADC 610.

Figure 7:
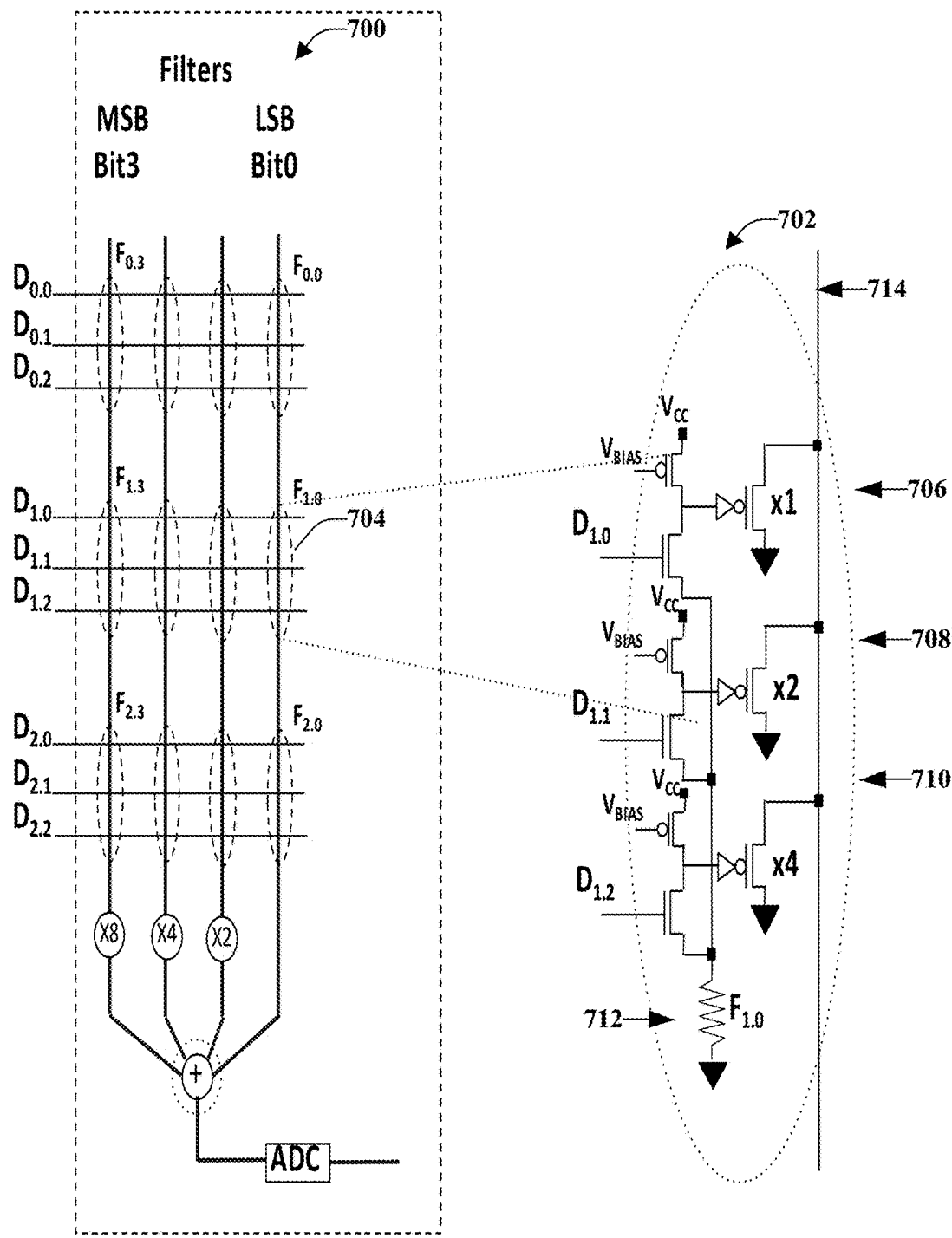
FIG. 7 illustrates another example, non-limiting circuit for matrix multiplication according to an embodiment of the subject disclosure.

FIG. 7 illustrates another example, non-limiting circuit for matrix multiplication according to an embodiment of the subject disclosure. In this implementation, the activation data D comprise three bits and the input data F comprise four bits. The schematic 700 on the left side of FIG. 7 depicts a similar layout for bit lines and the orientation of filter circuits to the preceding figures (e.g., FIG. 6, supra). In contrast, schematic 700 provides separate input wordlines for each of the D bits, and different filter circuits 704 to receive multiple wordline inputs concurrently and emulate higher order D bits. The filter circuits 704 are illustrated in more detail with the cutout of filter circuit 702. It is noted that the circuit 702 is an extension of circuit 308 in FIG. 3B.

The filter circuit 702 on the right side illustrates an exploded view of the circuits 704 depicted in the dashed ovals of schematic layout 700. As illustrated by the filter circuit 702, three wordlines $D_{1,0}$, $D_{1,1}$, and $D_{1,2}$ provide input to the filter circuit 702. For other embodiments, filter circuit 702 can be modified to accommodate larger numbers of D bits and larger numbers of wordlines. Further, the filter circuit 702 can be programmed into a single resistive switching memory device 712 that represents the value of an associated one of the F bits (e.g., F bit $F_{1,0}$ in the case of the filter circuit 702). In a similar manner, another iteration of filter circuit 702 (with appropriate values of respective F bits programmed to the resistive switching memory devices) is provided at cross sections of each bit line and wordlines for the $D_{1,x}$, and likewise at cross sections of each bit line and wordlines for the $D_{0,x}$ and $D_{2,x}$, as illustrated in schematic layout 700

Continuing with reference to the filter circuit 702, the value of the resistive switching memory device in combination with the values of $D_{1,0}$, $D_{1,1}$, and $D_{1,2}$, are configured to turn the transistors 706, 708, 710 "on" or "off." Note that transistors 706, 708 and 710 have labels x1, x2, x4, respectively, that connote their relative conductances when activated, and accordingly the relative current drawn from the bit line 714 when active. More explicitly, transistor 710 can be selected to have approximately 4× the conductance of transistor 706 when active, and transistor 708 can be selected to have approximately 2× the conductance of transistor 706 when active, for this example. This relative current multiplication effect can emulate higher orders of the D bits (e.g., zero order D bit receiving ×1 relative current multiplication, first order D bit receiving 2× relative current multiplication, and so on). The operation at each transistor 706, 708, 710 is similar to the operation of circuit 308 of FIG. 3B, wherein each wordline $D_{1,0}$, $D_{1,1}$, and $D_{1,2}$ is input to a respective circuit, and a given transistor (e.g., transistor 706) is deactivated unless both resistive switching memory device 712 is programmed to a low resistance state and its associated D bit wordline (e.g., $D_{1,0}$) is a "1", or high value. When resistive switching memory device 712 is erased to the high resistance state, circuit 702 will contribute no substantial current to bit line 714.

To illustrate this operation, if the resistive switching memory device 712 stores a "0" (e.g., is in a high resistance state), $V_{cc}$ appears at inputs of the respective inverters, which output respective low signals (e.g., "0" to respective gates of the NMOS transistors. In such conditions the NMOS transistors are deactivated and do not provide low resistance paths to ground, thereby drawing no significant current on the bit line 714.

Conversely, if the resistive switching memory 706 stores a "1" (e.g., is in a low resistance state) the respective D bit inputs will determine whether Vcc at any given gate of transistors 706, 708, 710 is pulled to ground. If D bit $D_{1,0}$ has an input data bit of "1" for instance, Vcc at the gate of transistor 706 is grounded, and a low signal is input to the inverter at the gate of transistor 706. Such inverter outputs a high signal (e.g., "1") to the gate of the NMOS transistor 706. In this state, the NMOS transistor is activated, providing a low resistance path to ground, and a corresponding current will be drawn on the bit line. This operation is similar for transistors 708 and 710 and their respective D bit inputs $D_{1,1}$ and $D_{1,2}$. Wordlines that have an activation data bit of "0" will not contribute to the current drawn on the bit line.

Figure 8:
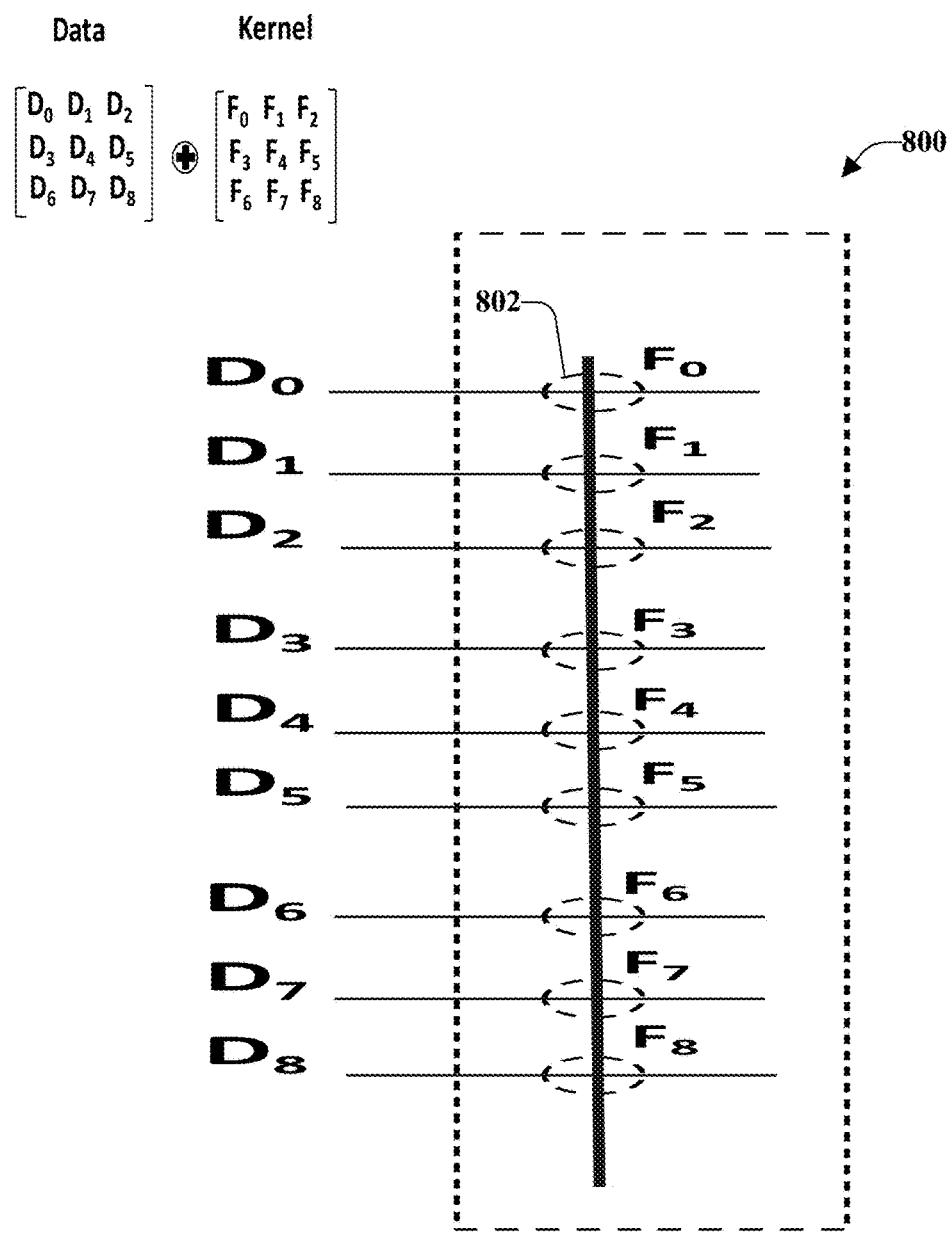
FIG. 8 illustrates an example, non-limiting circuit for a dot product accelerator (DPA) for convolution arithmetic according to an embodiment of the subject disclosure.

FIG. 8 illustrates an example, non-limiting circuit 800 for a dot product accelerator (DPA) for convolution arithmetic according to an embodiment of the subject disclosure. In this implementation, there is a 3×3 data matrix ($D_0$, $D_1$, ... $D_8$) and a 3×3 kernel ($F_0$, $F_1$, ... $F_8$). Further, the data and the kernel are single bits (e.g., 1 bit-Data, 1 bit-Kernel). The following equation can be utilized:

$$\begin{bmatrix} D_0 & D_1 & D_2 \\ D_3 & D_4 & D_5 \\ D_6 & D_7 & D_8 \end{bmatrix} \oplus \begin{bmatrix} F_0 & F_1 & F_2 \\ F_3 & F_4 & F_5 \\ F_6 & F_7 & F_8 \end{bmatrix}. \qquad \text{Equation 6}$$

In this implementation, the kernel is superimposed over the data as illustrated in the circuit 800. Thus, the filter is placed on top of the data and the results of the data bits and the filter bits are input into a summing circuit to obtain the result. According to some implementations, the convolution does not need to be a 3×3 matrix; instead any number can be utilized (e.g., a 5×5 matrix, a 7×7 matrix, and so on).

In further detail, all D values can be input concurrently and acted upon by the respective F filter circuits to determine the contribution of current on bit lines by the circuits 802 at cross sections of bit lines and wordlines. Each circuit 802 contributes current to the bit line if Dx is "1" and its corresponding resistive switching memory device stores a "1" (e.g., it is in a low resistance state). Thus, the currents from the circuit 802 will add up on the bit line concurrently and the sum can be measured at a single time.

Figure 9:
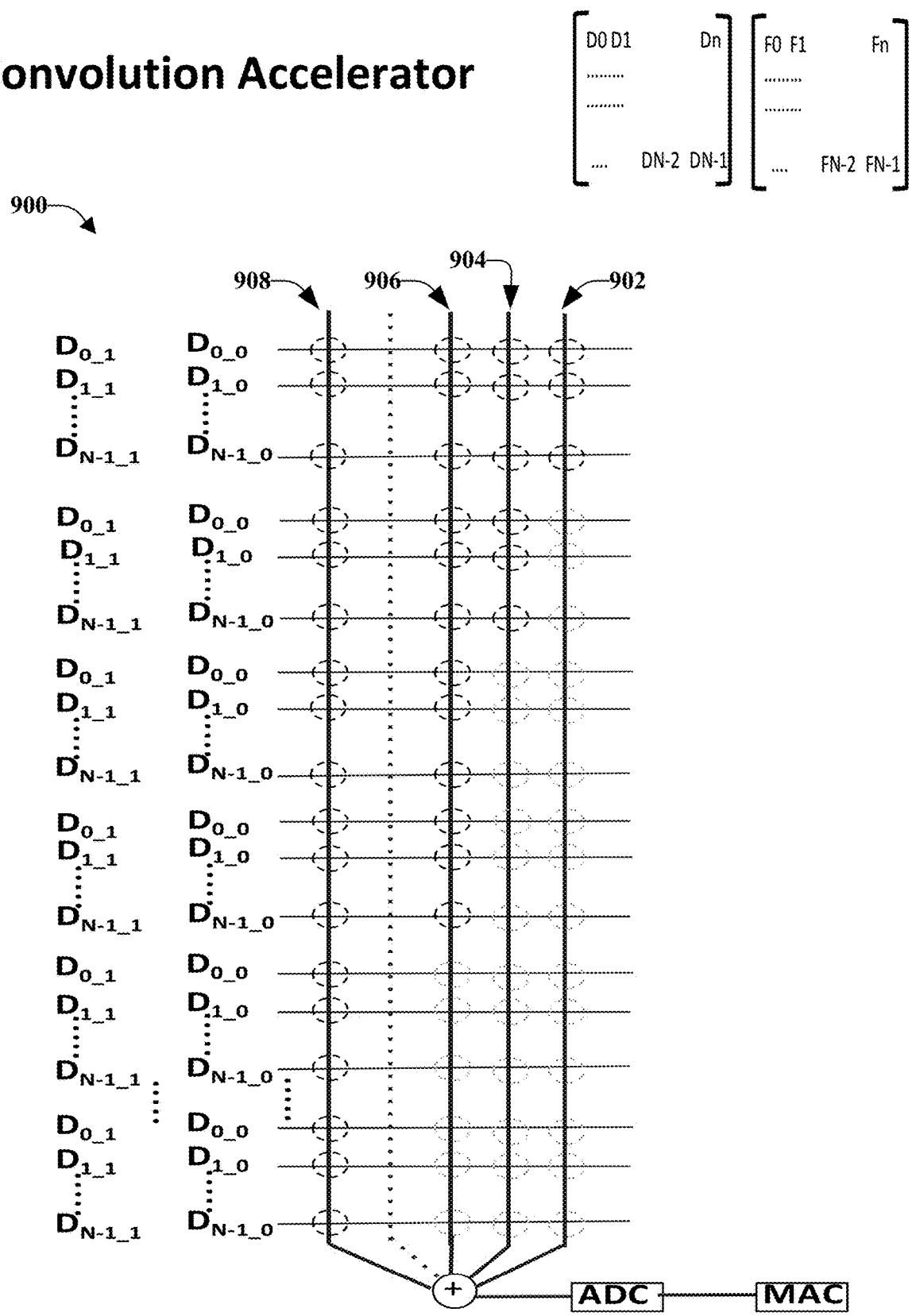
FIG. 9 illustrates an example, alternative embodiment of a convolution accelerator according to an embodiment of the subject disclosure.

FIG. 9 illustrates an example, alternative embodiment of a convolution accelerator 900 according to an embodiment of the subject disclosure. Instead of multiplying current to emulate higher order F bits, there are provided duplicate sets of wordlines on a given bit line, each wordline having a filter circuit that can draw current on the bit line. FIG. 9 facilitates current multiplication that emulates higher bit orders with additional hardware rather than with current multiplication circuits (e.g., a current mirror). A least significant bit line 902 has a single set of wordlines and filter circuits, a second least significant bit line has two sets of wordlines and filter circuits, the third least significant bit line has three sets of wordlines and filter circuits, and so on, up to a most significant bit line having Y sets of wordlines and filter circuits, Y being the number of bit lines (and the number of filter bits, or F bits) in convolution accelerator 900.

For an n×n matrix having a filter with Y bits, the matrix multiplication is modeled by the number of bit lines (columns) equal to the filter size, or Y, and the number of rows N equal to $n^2 * 2^{Y-1}$. It is noted that the grey circles represent circuits that have no impact on the matrix multiplication, for instance because no filter circuit exists at those bit line-wordline intersections, or because resistive switching memory devices of those filter circuits are all erased (e.g., in high resistance state) and do not measurably contribute to current on the bit lines 902, 904, 906, 908.

The array dimension (number of wordlines and bit lines) of convolution accelerator 900 is determined by the matrix size n and number of bits in the filter Y. The number of columns is equal to the bit filter size Y and the number of rows is given by the equation $n^2 * 2^{Y-1}$. In an example, a matrix of 5×5 and a 6 bit filter can result in an array size of 800×6, which is derived from the following:

$$n^2 * 2^{Y-1} = 5^2 * 2^{6-1}$$
$$= 5^2 * 2^5$$
$$= 25 * 32$$
$$= 800$$

In another example, for a matrix 3×3 and an 8-bit filter, the array size is 1152×8, which is derived as follows:

$$n^2 * 2^{Y-1} = 3^2 * 2^{8-1}$$
$$= 3^2 * 2^7$$
$$= 9 * 128$$
$$= 1152$$

The data bits are shifted serially, with one iteration per bit of data. Further, the MAC can multiply the data by 2** (Iteration-1) and the data can be accumulated. In an alternative implementation, additional arrays of the convolution accelerator each receiving one iteration of the D bits, and the results can be summed.

For the implementation of FIG. 9, the following equation represents the matrix multiplication implemented by convolution accelerator 900.

$$\begin{bmatrix} D0 & D1 & & Dn \\ & \cdots & & \\ & \cdots & & \\ & \cdots & DN-2 & DN-1 \end{bmatrix} \begin{bmatrix} F0 & F1 & & Fn \\ & \cdots & & \\ & \cdots & & \\ & \cdots & FN-2 & FN-1 \end{bmatrix}. \quad \text{Equation 7}$$

Figure 10:
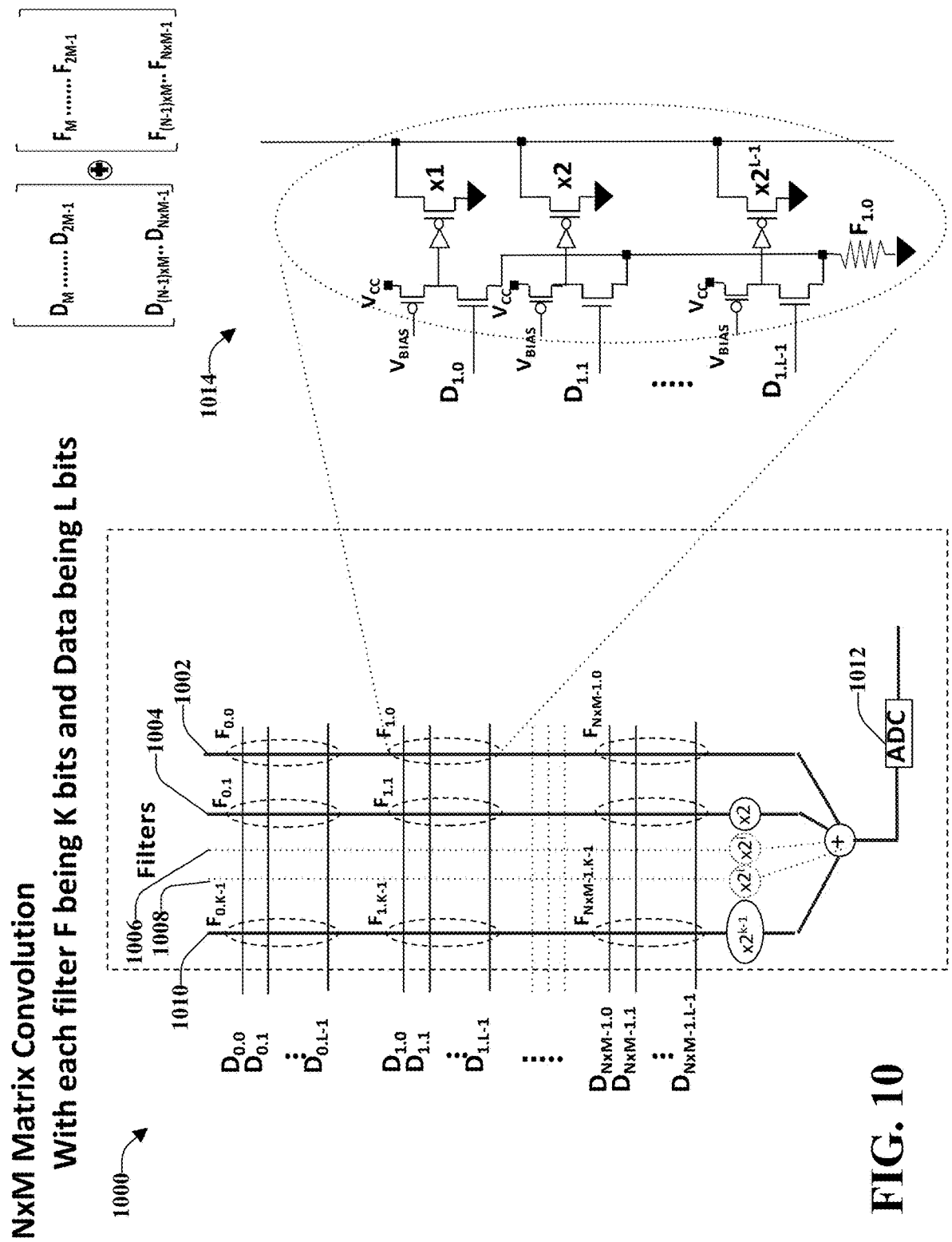
FIG. 10 illustrates another example, non-limiting matrix convolution according to an embodiment of the subject disclosure.

FIG. 10 illustrates another example, non-limiting matrix convolution 1000 according to an embodiment of the subject disclosure. This implementation utilizes a multi-bit filter and a multi-bit kernel. The input data bits F comprise K number of bits and the activation data bits comprise L number of bits, where K and L are integers. According to some implementations, K and L are the same value. However, according to some implementations, K and L are different values.

As illustrated, there are K bit lines, a first bit line 1002, a second bit line 1004, up through a K-2 bit line 1006, a K-1 bit line 1008, and a $K^{th}$ bit line 1010. The first bit line 1002 can include the LSB or zero order bit: Bit 0. The second bit line 1004 can include the second LSB or first order bit: Bit 1. The K-2 bit line 1006 can include the third most significant bit (third MSB) or Bit K-2. The fourth bit line 1008 can include the second MSB or K02. Further, the fifth bit line 1010 can include the MSB or Bit K-1.

In response to activation bit values being input on the wordlines, current drawn on the first bit line 1002 is provided to a summing circuit 1012 to obtain the LSB value (e.g., the multiplier is 1) for the K-bit filter. Current on the second bit line 1004 in response to input of the activation bit values is provided to a ×2 current multiplication circuit (e.g., a ×2 current mirror, or the like) to emulate a relative value of the second LSB. The ×2 multiplication circuit, therefore, multiplies the current on bit line 1004 by a factor of two to obtain the second LSB. The third MSB is also provided to the summing circuit 1012. In a similar manner, current on the K-2 bit line 1006 is provided to a ×$2^i$ current multiplication circuit, the output of which is received at the summing circuit (e.g., the third MSB value), where "i" is a placeholder integer and its value is determined based on the bit line number associated with the bit line of that multiplier circuit (e.g., k minus 3 for the third MSB). For the K-2 bit line 1006, the current multiplication circuit will be a ×$2^{K-3}$ multiplier. Similarly, current on the second MSB bit line 1008 is provided to a ×$2^i$ current multiplication circuit, the output of which is received at the summing circuit (e.g., the second MSB value), where in this case the current multiplication circuit will be a ×$2^{K-2}$ multiplier. Lastly, current on the K bit line 1010 is provided to an x$2^{K-1}$ current multiplication circuit, the output of which is received at the summing circuit 1012 (e.g., the MSB value).

The filter circuit 1014 on the right (which is an exploded view of the filter circuit $F_{1,0}$) includes transistors x1, x2, through x$2^{L-1}$, having relative conductance values (when activated) that provide current multiplication for higher orders of the D bits. For the matrix convolution 1000 of FIG. 10, the following equation represents the matrix multiplication implemented by the illustrated circuit.

$$\begin{bmatrix} D_0 & D_1 & \cdots & D_{M-1} \\ D_M & \cdots & D_{2M-1} \\ \\ D_{(N-1) \times M} & \cdots & D_{N \times M-1} \end{bmatrix} \oplus \begin{bmatrix} F_0 & F_1 & \cdots & F_{M-1} \\ F_M & \cdots & F_{2M-1} \\ \\ F_{(N-1) \times M} & \cdots & F_{N \times M-1} \end{bmatrix}. \quad \text{Equation 8}$$

Figure 11:
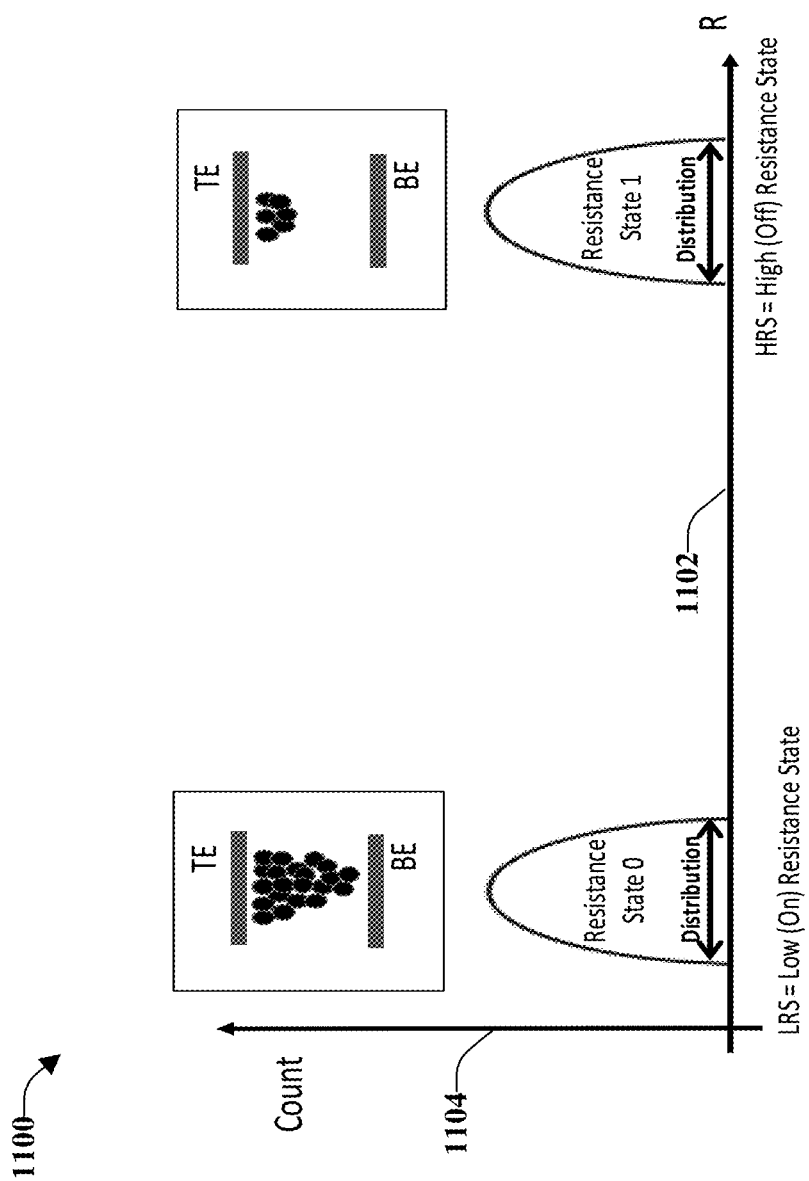
FIG. 11 illustrates an example, non-limiting chart of values and distribution for on/off resistance according to an embodiment of the subject disclosure.

FIG. 11 illustrates an example, non-limiting chart 1100 of values and distribution for on/off resistance values of multiple resistive switching memory devices, according to an embodiment of the subject disclosure. Resistance is illustrated on the horizontal axis 1102 and count (number of such memory devices) is illustrated on the vertical axis 1104. On the horizontal axis 1102, the low (on) resistance state is on the left and the high (off) resistance state is on the right. Each state comprises a range of resistance values for which a memory device could be categorized in that state.

The resistance of the cell and its distribution at each state can be a factor in circuit design of 214 in FIG. 2 or circuit 300 in FIG. 3A. In read intensive applications where writes/ReRAM updates do not occur often, ReRAM write algorithms (both program and erase) can be optimized to maximize the "On" and "Off" resistances as well as to narrow the resistance distributions of the "On" and "Off" states, respectively. Further, wide distribution, particularly at "Off" state, can affect the computation adversely.

In a sample of resistive switching memory circuits (e.g., 1,000 ReRAMs) illustrated in FIG. 11, the actual resistance value of the low resistance state has a first distribution for the sample resistive switching memory circuits and for the high resistance state there is a second distribution of the actual resistance for those sample resistive switching memory circuits. Ideally, those distributions should be as tight as possible.

As discussed herein, the data bits programmed in the filters might not be changed often and the programming is not performed during the computational phase. Different write algorithms can be applied to maximize the on/off state distributions of the ReRAMs and the ratio, as discussed herein.

Figure 12:
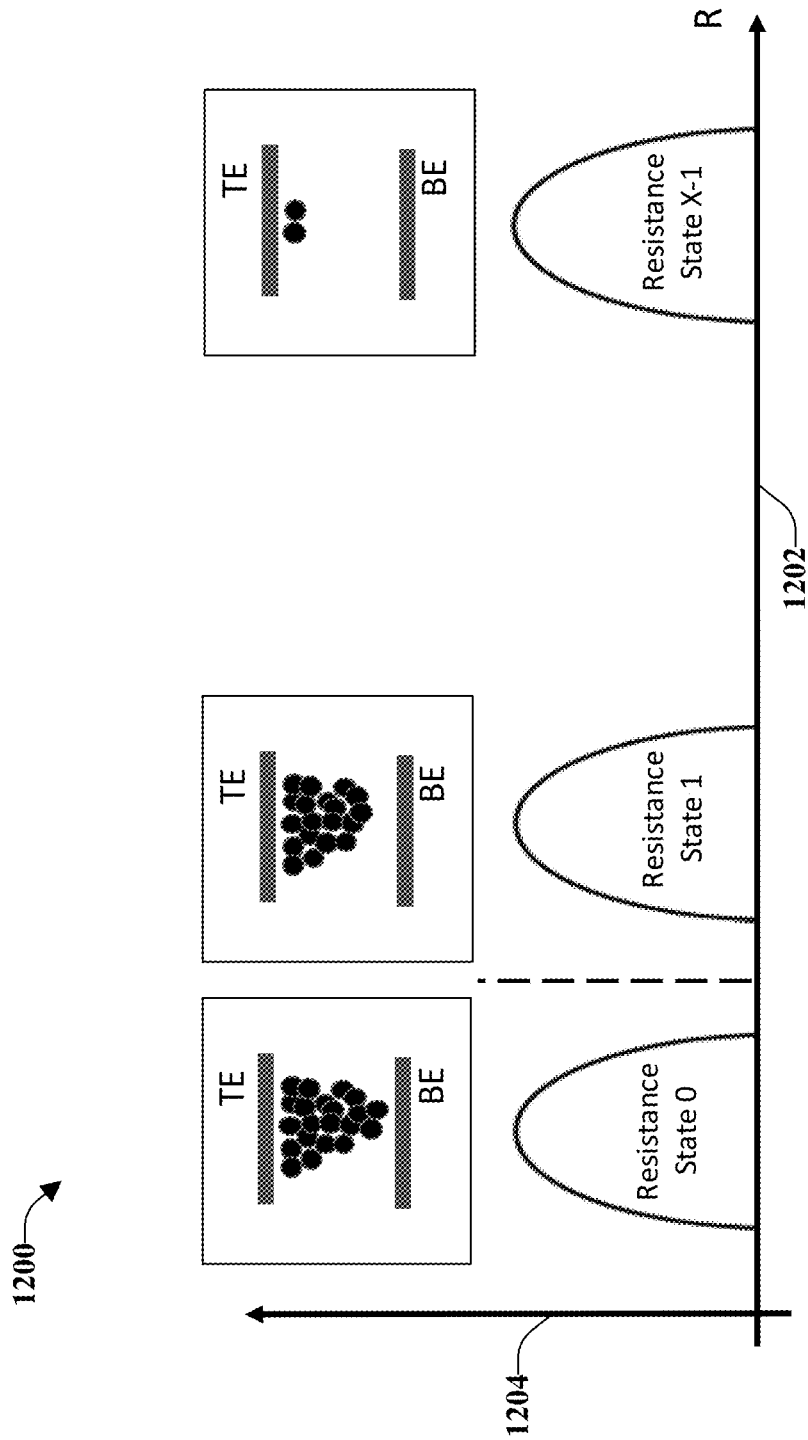
FIG. 12 illustrates an example, non-limiting chart of a multi-level resistance ReRAM according to an embodiment of the subject disclosure.

FIG. 12 illustrates an example, non-limiting chart 1200 of a multi-level resistance ReRAM according to an embodiment of the subject disclosure. Multi-bit ReRAMs can be utilized to model multiple filter bits in a matrix multiplication, which can effectively reduce the number of columns (bit lines) in an array and circuitry associated with the bit lines.

Figure 13:
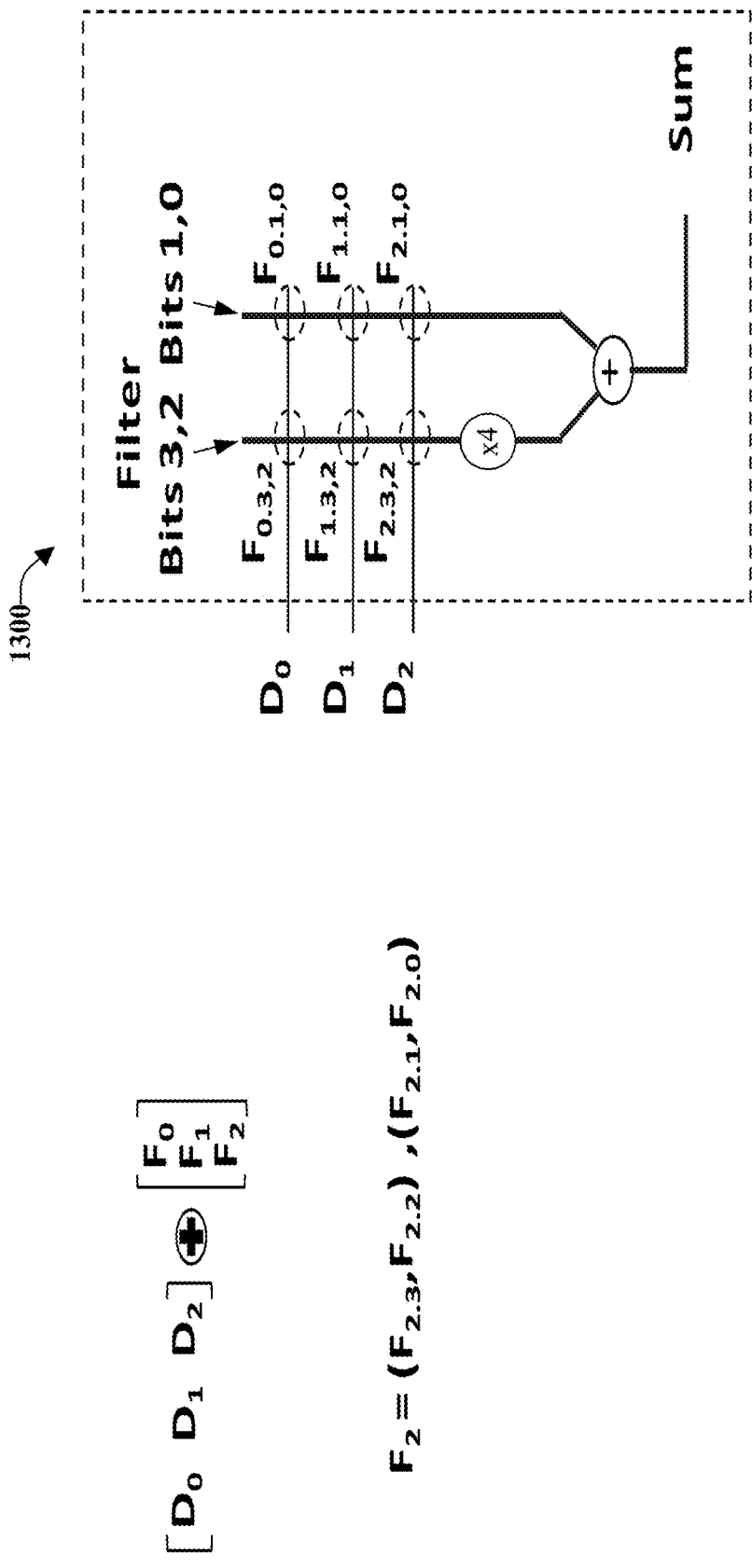
FIG. 13 illustrates an example circuit for matrix multiplication utilizing a 4-state (2-bits) multi-level resistance ReRAM according to an embodiment of the subject disclosure.

The more bits that a single multi-level ReRAM can store, the more filter bits can be modeled with a single filter circuit FIG. 13 illustrates an example circuit 1300 for a 1×3 to 3×1 matrix multiplication utilizing a 4-state (2-bit) multi-level resistance (MLR) ReRAM according to an embodiment of the subject disclosure. For this matrix multiplication, each filter F is 4 bits and the activation data bits D are 1 bit. The 2 bit MLC provides a resistive switching memory circuit that has four states. Each bit line having 2-bit MLC filter circuits can represent two of the 4-bit F bits. Thus, two such bit lines (as illustrated, with the second bit line receiving ×4 multiplication) can model the 4-bit filter. Thus, the following equation can represent the matrix multiplication implemented by circuit 1300:

$$[D_0 \ D_1 \ D_2] \oplus \begin{bmatrix} F_0 \\ F_1 \\ F_2 \end{bmatrix} \text{ and} \quad \text{Equation 9}$$

$$F_2 = (F_{2.3}, F_{2.2}), (F_{2.1}, F_{2.0}).$$

The resistance states of the MLCs can be selected to have proportional resistance values to match values of filters Fx. In the example given by circuit 1300, MLC filter circuits can have ReRAMs with a resistance state 0 representing lowest resistance state, resistance state 3 representing highest resistance state, and resistance states 1 and 2 representing resistance states in-between states 0 and 3, with state 1 having a lower resistance than state 2. As described, MLC resistive memory devices can be utilized to reduce the number of bit lines, to shrink the array size for matrix multiplication and to and conserve power.

Figure 14:
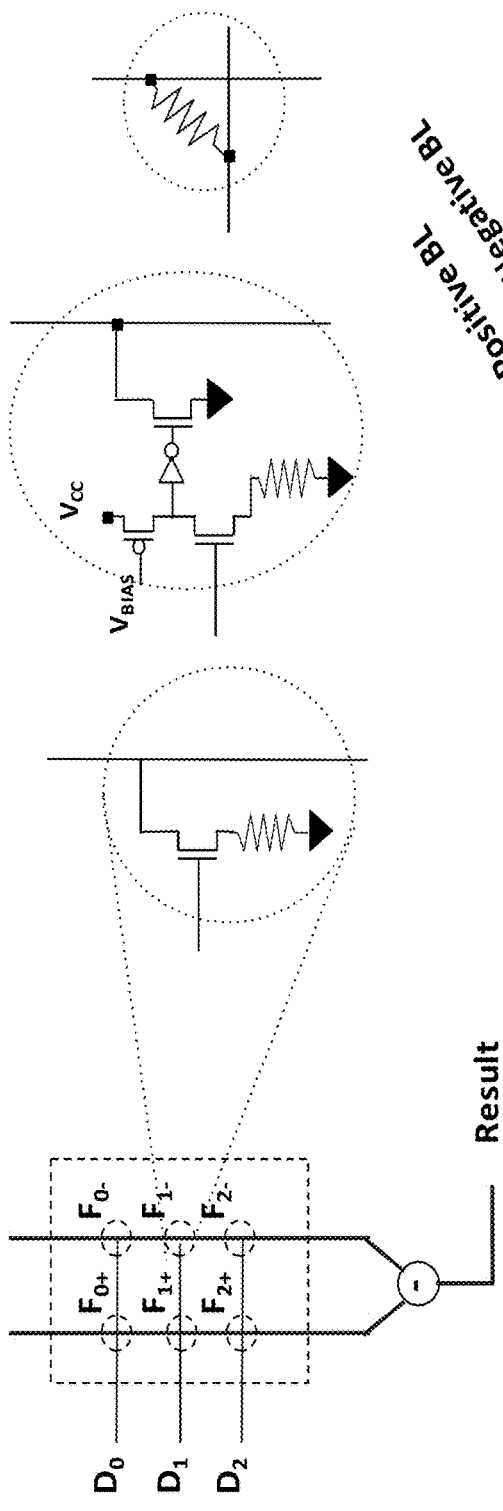
FIG. 14 illustrates an example, non-limiting implementation of a signed matrix multiplication, incorporating positive and negative bit values as an example, according to an embodiment of the subject disclosure.
Figure 14:
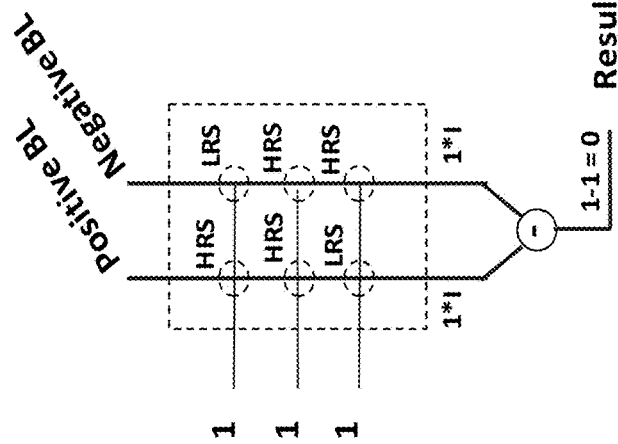

FIG. 14 illustrates an example, non-limiting implementation of a signed matrix multiplication 1400, incorporating positive and negative bit values as an example, according to an embodiment of the subject disclosure. In one embodiment, each F bit is represented by two bit lines, namely, a positive bit line and a negative bit line for that F-bit, each having their own filter circuits. An F-bit having a positive value is programmed into a filter circuit on the positive bit line (the negative bit line filter circuit remaining erased) and an F-bit having a negative value is programmed into the negative bit line (the positive bit line filter circuit remaining erased). As an explicit non-limiting example, for an F-bit value of "0," nothing is programmed to the positive bit line filter circuit or the negative bit line filter circuit (e.g., both filter circuits are erased). If the F-bit value is "1," the positive bit line is programmed. If the result is "−1," the negative bit line is programmed. When activation data is received at the filter circuit, the positive bit line includes the sum of all the positive currents and the negative bit line includes the sum of the negative currents. In this case, the negative bit line is subtracted from the positive bit line to derive the result for a given F-bit. For this implementation, the following equations are implemented in the example circuit of matrix multiplication 1400:

$$[D_0 \ D_1 \ D_2] \times \begin{bmatrix} F_0 \\ F_1 \\ F_2 \end{bmatrix} = D_0 \times F_0 + D_1 \times F_1 + D_2 \times F_2. \quad \text{Equation 10}$$

$$[1 \ 1 \ 1] \times \begin{bmatrix} -1 \\ 0 \\ 1 \end{bmatrix} = 1X - 1 + 1X0 + 1X1 = 0. \quad \text{Equation 11}$$

The activation bits D are [1 1 1], whereas the input filter bits are [−1 0 1]. Both the D bits and F bits are single bit numbers (zero order bits only). Note that the bottom right picture illustrates the positive bit line and negative bit line programming to achieve the [−1 0 1] input filter bit matrix.

Figure 15:
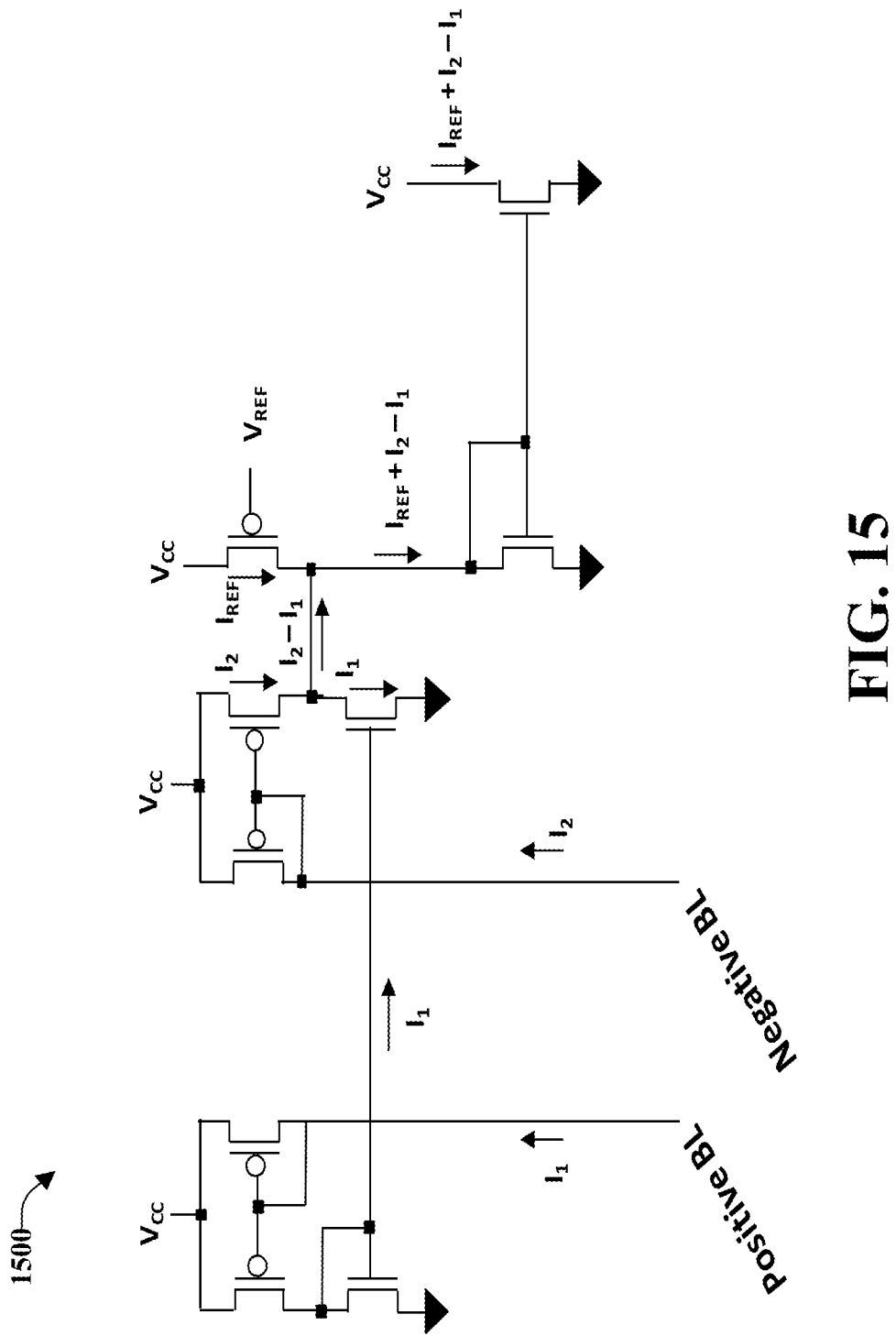
FIG. 15 illustrates an example, non-limiting circuit for sensing and subtracting current on multiple bit lines according to an embodiment of the subject disclosure.

FIG. 15 illustrates an example, non-limiting circuit 1500 for sensing and subtracting current on multiple bit lines according to an embodiment of the subject disclosure. Current from the bit lines are subtracted (e.g., the current from the negative bit line is subtracted from the current from the positive bit line). The result can be positive or negative.

According to some implementations, $I_{REF}$ can be added to obtain a positive result. Circuitry for generating $I_{REF}$ can be designed to make the result of $I_{REF}+I_2-I_1$ positive. Therefore, any following circuitry only has to deal with current in one direction. So $I_{REF} > \max(I_2, I_1)$ by few uA.

Figure 16:
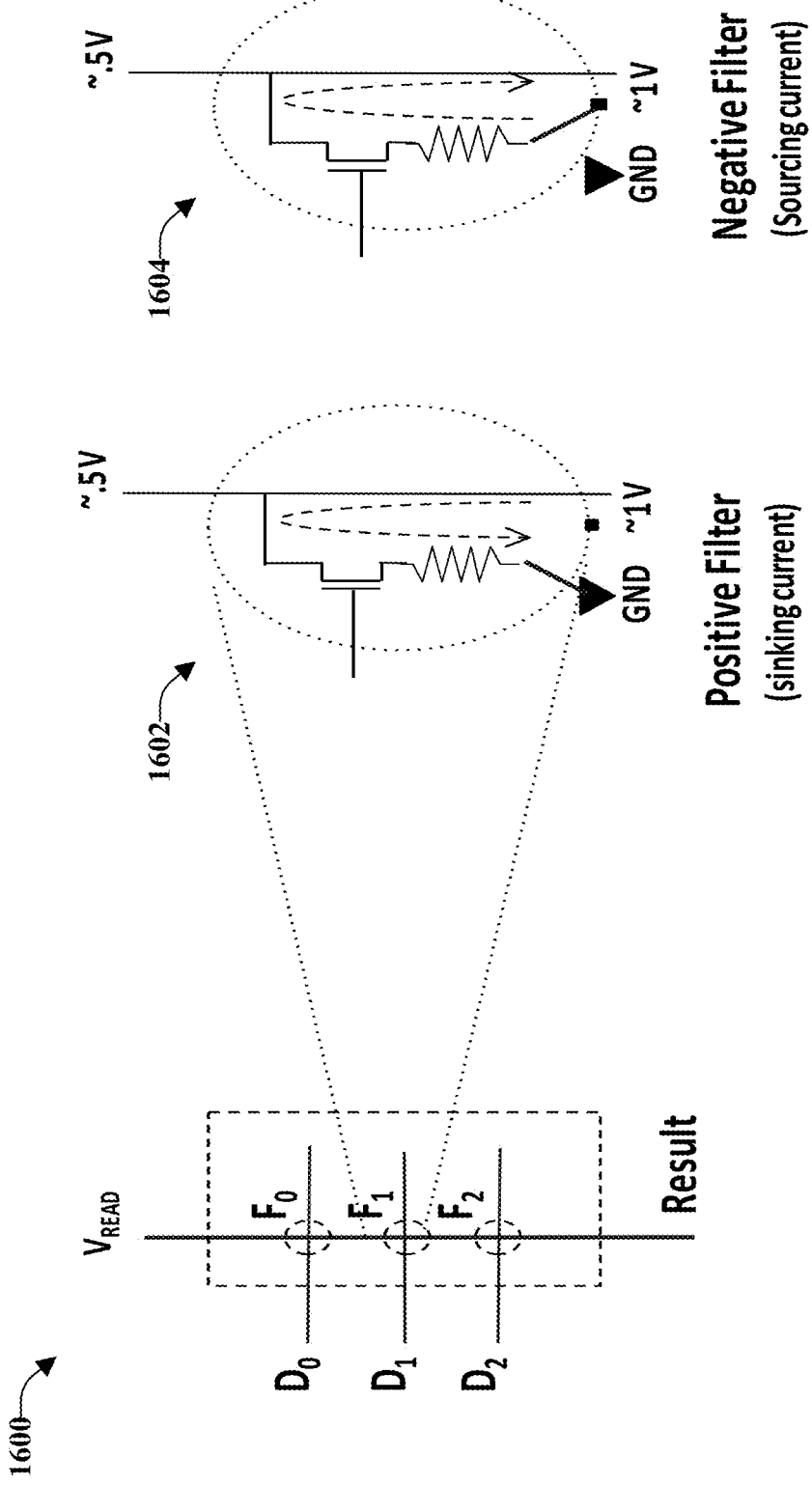
FIG. 16 illustrates an example, non-limiting alternative circuit for signed matrix multiplication according to an embodiment of the subject disclosure.

FIG. 16 illustrates an example, non-limiting alternative circuit 1600 for signed matrix multiplication according to an embodiment of the subject disclosure. An exploded view of $F_1$ is illustrated by positive filter circuit 1602 and negative filter circuit 1604. The positive filter(s) will contribute (e.g., sink) current (adding to the current on the bit line in a forward direction); the negative filter(s) will source current in a reverse direction (subtracting from the current on the bit line in the forward direction). The result is accumulation of positive and negative current in the bit line. By convention, if current is being contributed on the bit line, the result is positive. However, if current is being sourced on the bit line, the result is negative.

Figure 17:
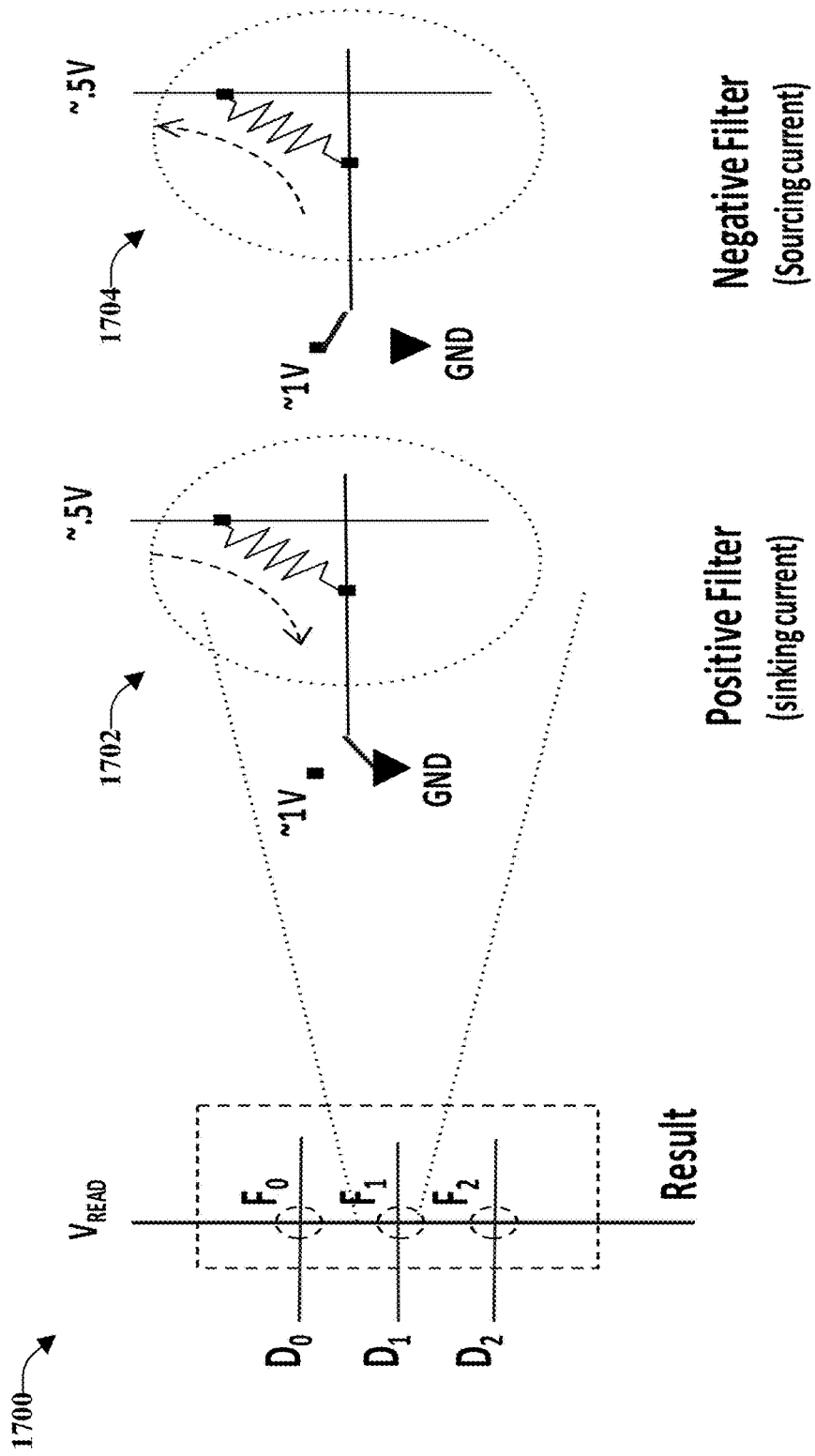
FIG. 17 illustrates an example, non-limiting circuit of an alternate embodiment for signed matrix multiplication according to an embodiment of the subject disclosure.

FIG. 17 illustrates an example, non-limiting circuit 1700 of an alternate embodiment for signed matrix multiplication according to an embodiment of the subject disclosure. An exploded view of filter circuit $F_1$ is illustrated by positive filter circuit 1702 and negative filter circuit 1704. The positive filter circuit 1702 will contribute current; the negative filter circuit 1704 will source the current. The result is accumulation of current in the bit line.

Figure 18:
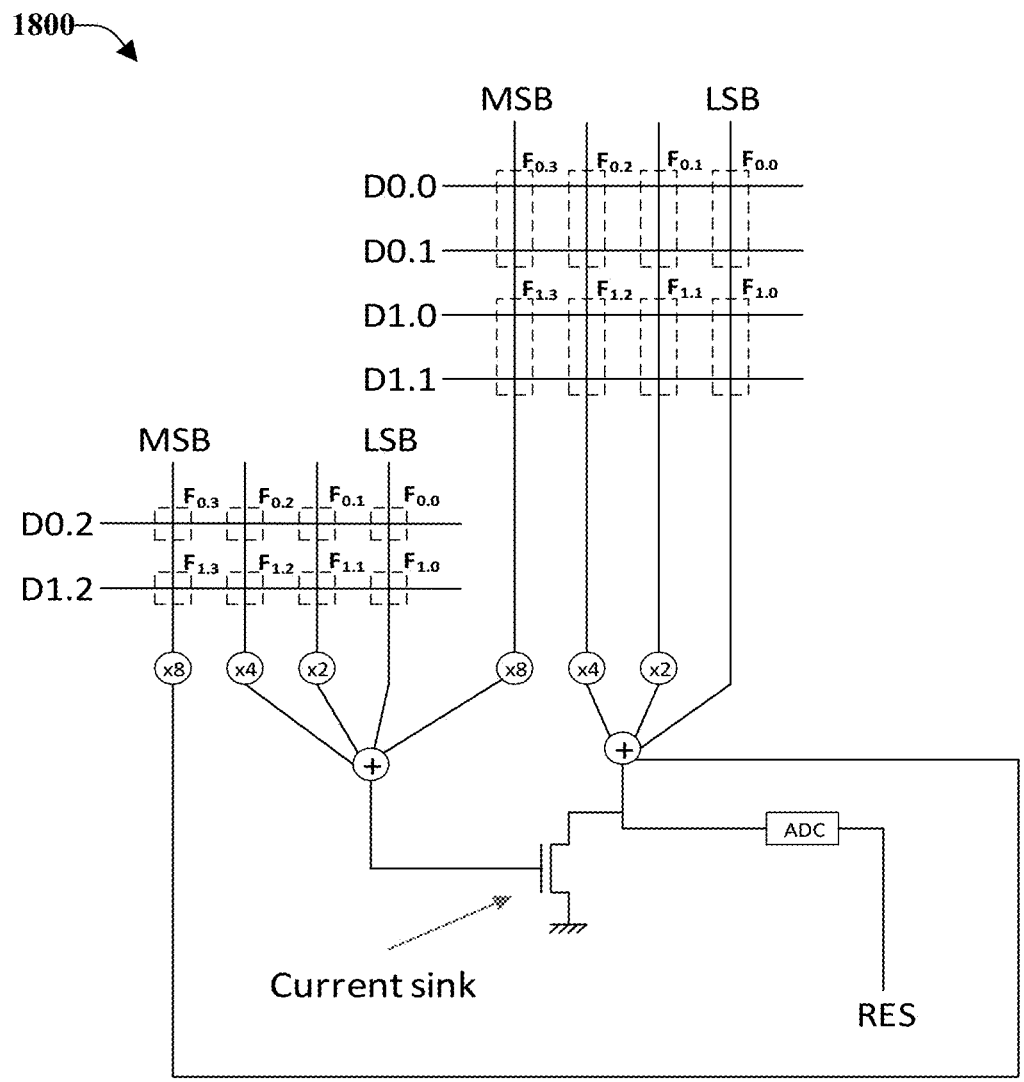
FIG. 18 illustrates an example, non-limiting circuit for a signed matrix dot-product according to an embodiment of the subject disclosure.

FIG. 18 illustrates an example, non-limiting circuit 1800 for a 1×2 signed matrix dot-product according to an embodiment of the subject disclosure. For this implementation, the filter F is 4 bits and the data D is 3 bits.

When using signed arithmetic, the MSB includes the sign. For example, 0xA4 (−92) is equal to 0x80 (−128)+0x24 (36). The current contribution for the negative elementary multiplications is used as a contributor to the current. The MSB of the filter multiplied with the MSB of the data is used as a source since it is the product of two negative numbers. Accordingly the following relationships apply:

(Not MSB)×(Not MSB)->source

MSB×MSB->source (Not MSB)×MSB->sink

MSB×(Not MSB)->sink

The diagrams included herein are described with respect to interaction between several memory cells, memory cell components, or memory architectures. It should be appreciated that such diagrams can include those memory cells, components and architectures specified therein, some of the specified memory cells/components/architectures, or suitable alternative or additional memory cells/components/architectures. Sub-components can also be implemented as electrically connected to other sub-components rather than included within a parent architecture. Moreover, some of the disclosed embodiments can be implemented as part(s) of other disclosed embodiments where suitable. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be read or programmed in groups (e.g., multiple memory cells read/programmed concurrently) or individually. Components of the disclosed architectures can also interact with one or more other components not specifically described herein but known by those of skill in the art or made evident by way of the context provided herein.

Example Method for Resistive Random Access Memory Matrix Multiplication Structures In view of the exemplary diagrams described above, process methods that can be implemented in accordance with the disclosed subject matter will be better appreciated with reference to flow charts. While for purposes of simplicity of explanation, the methods are shown and described as a series of blocks, it is to be understood and appreciated that the claimed subject matter is not limited by the order of the blocks, as some blocks can occur in different orders and/or concurrently with other blocks from what is depicted and described herein. Moreover, not all illustrated blocks can be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 19:
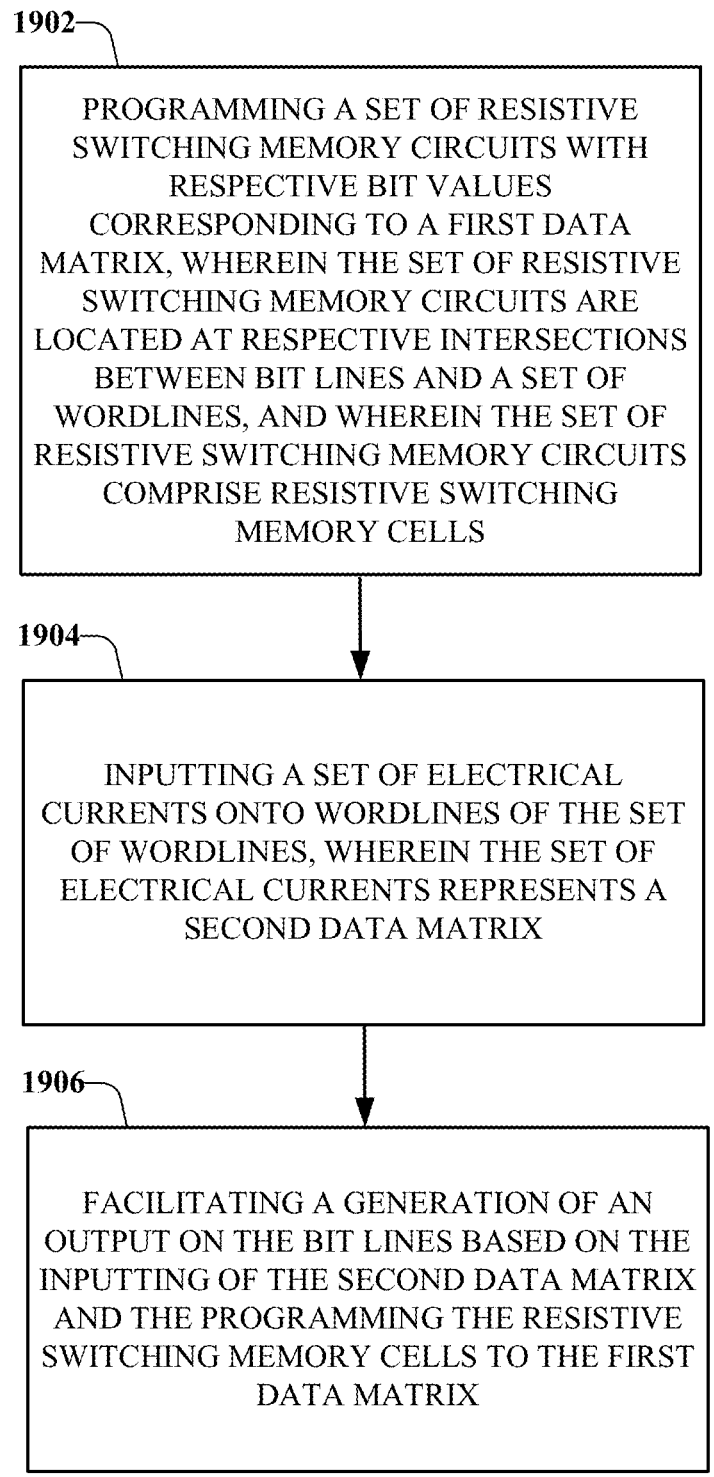
FIG. 19 illustrates a flowchart of an example method 1900 for operation of resistive random access memory matrix multiplication structures according to an embodiment of the subject disclosure.

FIG. 19 illustrates a flowchart of an example method 1900 for operation of resistive random access memory matrix multiplication structures according to an embodiment of the subject disclosure. At 1902 a set of resistive switching memory circuits can be programmed with respective bit values corresponding to a first data matrix. The set of resistive switching memory circuits can be located at respective intersections between bit lines and a set of wordlines. For example, the resistive switching memory circuits can be located on the bit lines. At 1904, a set of electrical currents can be input onto wordlines of the set of wordlines. The set of electrical currents can represent a second data matrix.

At 1906, a generation of an output on the bit lines can be facilitated based on the inputting of the second data matrix and the programming the resistive switching memory cells to the first data matrix. In an implementation, facilitating the generation of the output can comprise facilitating the output of a dot product multiplication result of the first data matrix and the second data matrix. According to another implementation, facilitating the generation of the output can comprise obtaining different dot product results for the first data matrix based on second data matrices applied to the set of wordlines.

In an example, the set of resistive switching memory circuits can comprise resistive switching memory cells. The first data matrix programmed to the set of resistive switching memory circuits can be a two-dimensional matrix. In an example, the first data matrix can be a data filter.

According to some implementations, facilitating the generation of the output can comprise facilitating a first programming operation that sets resistive switching memory circuits to the first data matrix. Further, to this implementation, a first set of multiple dot product results of the first data matrix can be obtained based on the first programming operation.

In some implementations, the method 1900 can comprise inputting a sequence of second data matrices on the set of wordlines. Further, to these implementations, the method 1900 can comprise obtaining a second set of multiple dot product results of second data matrices based on the inputting the sequence of second data matrices.

Example Operating Environments

Figure 20:
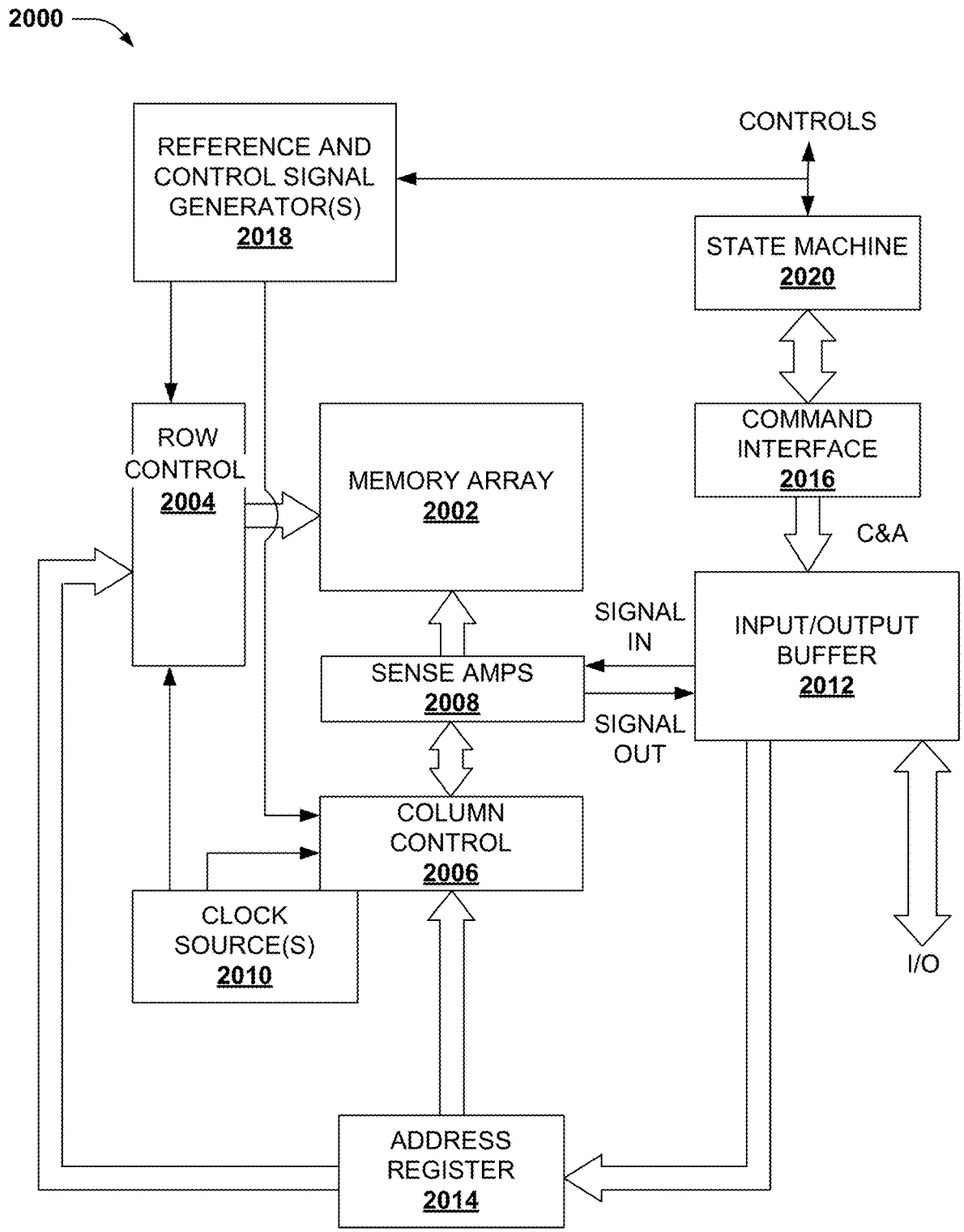
FIG. 20 illustrates a block diagram of an example electronic operating environment in accordance with certain embodiments of the subject disclosure.

In order to provide a context for the various aspects of the disclosed subject matter, FIG. 20, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects can also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g., CF card, USB memory stick, SD card, microSD card), or the like. In a distributed computing environment, program modules can be located in both local and remote memory storage modules or devices.

FIG. 20 illustrates a block diagram of an example operating and control environment 2000 for a memory array 2002 of a multi-bank memory cell array according to aspects of the subject disclosure. In at least one aspect of the subject disclosure, memory array 2002 can comprise memory selected from a variety of memory cell technologies. In at least one embodiment, memory array 2002 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory array 2002 can be configured to operate according to a read operation as provided herein.

A column controller 2006 and sense amps 2008 can be formed adjacent to memory array 2002. Moreover, column controller 2006 can be configured to activate (or identify for activation) a subset of bit lines of memory array 2002. Column controller 2006 can utilize a control signal provided by a reference and control signal generator(s) 2018 to activate, as well as operate upon, respective ones of the subset of bit lines, applying suitable program, erase or read voltages to those bit lines. Non-activated bit lines can be kept at an inhibit voltage (also applied by reference and control signal generator(s) 2018), to mitigate or avoid bit-disturb effects on these non-activated bit lines.

In addition, operating and control environment 2000 can comprise a row controller 2004. Row controller 2004 can be formed adjacent to and electrically connected with wordlines of memory array 2002. Further, utilizing control signals of reference and control signal generator(s) 2018, row controller 2004 can select particular rows of memory cells with a suitable selection voltage. Moreover, row controller 2004 can facilitate program, erase or read operations by applying suitable voltages at selected wordlines.

Sense amps 2008 can read data from, or write data to the activated memory cells of memory array 2002, which are selected by the column controller 2006 and the row controller 2004. Data read out from memory array 2002 can be provided to an input and input/output buffer 2012 (e.g., an LPDDR buffer, in some embodiments). Likewise, data to be written to memory array 2002 can be received from the input and input/output buffer 2012 and written to the activated memory cells of memory array 2002.

A clock source(s) 2010 can provide respective clock pulses to facilitate timing for read, write, and program operations of row controller 2004 and column controller 2006. Clock source(s) 2010 can further facilitate selection of wordlines or bit lines in response to external or internal commands received by operating and control environment 2000. Input and input/output buffer 2012 can comprise a command and address input, as well as a bidirectional data input and output. Instructions are provided over the command and address input, and the data to be written to memory array 2002 as well as data read from memory array 2002 is conveyed on the bidirectional data input and output, facilitating connection to an external host apparatus, such as a computer or other processing device (not depicted, but see e.g., computer 2102 of FIG. 21, below).

Input and input/output buffer 2012 can be configured to receive write data, receive an erase instruction, receive a status or maintenance instruction, output readout data, output status information, and receive address data and command data, as well as address data for respective instructions. Address data can be transferred to row controller 2004 and column controller 2006 by an address register 2010. In addition, input data is transmitted to memory array 2002 via signal input lines between sense amps 2008 and input and input/output buffer 2012, and output data is received from memory array 2002 via signal output lines from sense amps 2008 to input and input/output buffer 2012. Input data can be received from the host apparatus, and output data can be delivered to the host apparatus via the I/O bus.

Commands received from the host apparatus can be provided to a command interface 2016. Command interface 2016 can be configured to receive external control signals from the host apparatus, and determine whether data input to the input and input/output buffer 2012 is write data, a command, or an address. Input commands can be transferred to a state machine 2020.

State machine 2020 can be configured to manage programming and reprogramming of memory array 2002 (as well as other memory banks of the multi-bank memory array). Instructions provided to state machine 2020 are implemented according to control logic configurations, enabling state machine 2020 to manage read, write, erase, data input, data output, and other functionality associated with memory array 2002. In some aspects, state machine 2020 can send and receive acknowledgments and negative acknowledgments regarding successful receipt or execution of various commands In further embodiments, state machine 2020 can decode and implement status-related commands, decode and implement configuration commands, and so on.

To implement read, write, erase, input, output, etc., functionality, state machine 2020 can control clock source(s) 2008 or reference and control signal generator(s) 2018. Control of clock source(s) 2008 can cause output pulses configured to facilitate row controller 2004 and column controller 2006 implementing the particular functionality. Output pulses can be transferred to selected bit lines by column controller 2006, for instance, or wordlines by row controller 2004, for instance.

Figure 21:
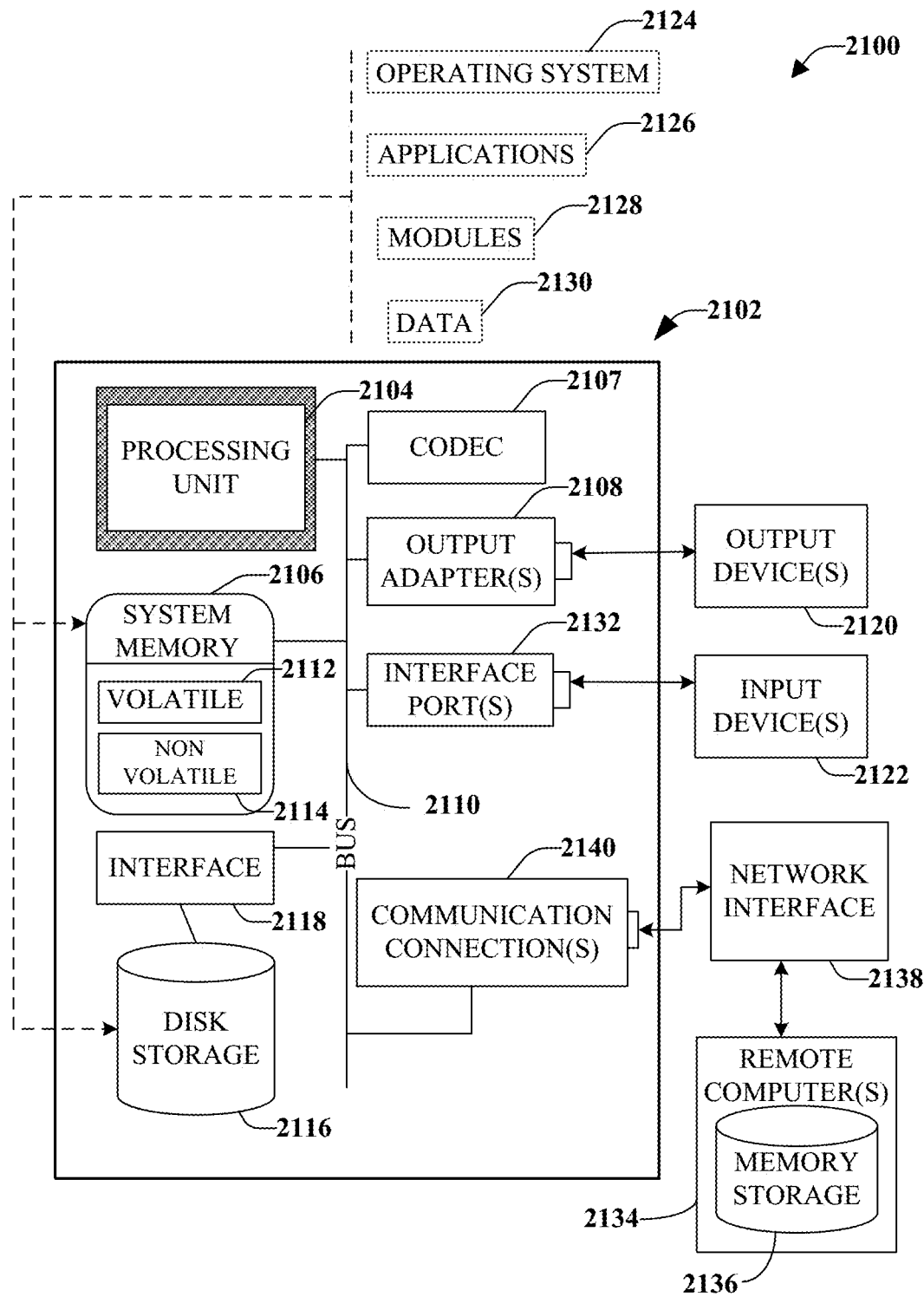
FIG. 21 depicts a block diagram of an example computing environment in accordance with certain embodiments of the subject disclosure.

With reference to FIG. 21, a suitable environment 2100 for implementing various aspects of the claimed subject matter includes a computer 2102. The computer 2102 includes a processing unit 2104, a system memory 2106, a codec 2135, and a system bus 2108. The system bus 2108 couples system components including, but not limited to, the system memory 2106 to the processing unit 2104. The processing unit 2104 can be any of various available processors. Dual microprocessors and other multiprocessor architectures also can be employed as the processing unit 2104.

The system bus 2108 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 2106 includes volatile memory 2110 and non-volatile memory 2112. The basic input/output system (BIOS), containing the basic routines to transfer information between elements within the computer 2102, such as during start-up, is stored in non-volatile memory 2112. In addition, according to present innovations, codec 2135 can include at least one of an encoder or decoder, wherein the at least one of an encoder or decoder can consist of hardware, software, or a combination of hardware and software. Although, codec 2135 is depicted as a separate component, codec 2135 can be contained within non-volatile memory 2112. By way of illustration, and not limitation, non-volatile memory 2112 can include read only memory (ROM), programmable ROM (PROM), electrically programmable ROM (EPROM), electrically erasable programmable ROM (EEPROM), or flash memory. Volatile memory 2110 includes random access memory (RAM), which acts as external cache memory. According to present aspects, the volatile memory can store the write operation retry logic (not shown in FIG. 21) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 2102 can also include removable/non-removable, volatile/non-volatile computer storage medium. FIG. 21 illustrates, for example, disk storage 2114. Disk storage 2114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 2114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 2114 to the system bus 2108, a removable or non-removable interface is typically used, such as interface 2116. It is appreciated that storage devices 2114 can store information related to a user. Such information might be stored at or provided to a server or to an application running on a user device. In one embodiment, the user can be notified (e.g., by way of output device(s) 2136) of the types of information that are stored to disk storage 2114 and/or transmitted to the server or application. The user can be provided the opportunity to opt-in or opt-out of having such information collected and/or shared with the server or application (e g., by way of input from input device(s) 2128).

It is to be appreciated that FIG. 21 describes software that acts as an intermediary between users and the basic computer resources described in the suitable operating environment 2100. Such software includes an operating system 2118. Operating system 2118, which can be stored on disk storage 2114, acts to control and allocate resources of the computer system 2102. Applications 2120 take advantage of the management of resources by operating system 2118 through program modules 2124, and program data 2126, such as the boot/shutdown transaction table and the like, stored either in system memory 2106 or on disk storage 2114. It is to be appreciated that the claimed subject matter can be implemented with various operating systems or combinations of operating systems.

A user enters commands or information into the computer 2102 through input device(s) 2128. Input devices 2128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2104 through the system bus 2108 via interface port(s) 2130. Interface port(s) 2130 include, for example, a serial port, a parallel port, a game port, and a universal serial bus (USB). Output device(s) 2136 use some of the same type of ports as input device(s) 2128. Thus, for example, a USB port can be used to provide input to computer 2102 and to output information from computer 2102 to an output device 2136. Output adapter 2134 is provided to illustrate that there are some output devices 2136 like monitors, speakers, and printers, among other output devices 2136, which require special adapters. The output adapters 2134 include, by way of illustration and not limitation, video and sound cards that provide a means of connection between the output device 2136 and the system bus 2108. It should be noted that other devices and/or systems of devices provide both input and output capabilities such as remote computer(s) 2138.

Computer 2102 can operate in a networked environment using logical connections to one or more remote computers, such as remote computer(s) 2138. The remote computer(s) 2138 can be a personal computer, a server, a router, a network PC, a workstation, a microprocessor based appliance, a peer device, a smart phone, a tablet, or other network node, and typically includes many of the elements described relative to computer 2102. For purposes of brevity, only a memory storage device 2140 is illustrated with remote computer(s) 2138. Remote computer(s) 2138 is logically connected to computer 2102 through a network interface 2142 and then connected via communication connection(s) 2144. Network interface 2142 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 2144 refers to the hardware/software employed to connect the network interface 2142 to the bus 2108. While communication connection 2144 is shown for illustrative clarity inside computer 2102, it can also be external to computer 2102. The hardware/software necessary for connection to the network interface 2142 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure can also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature can have been disclosed with respect to only one of several implementations, such feature can be combined with one or more other features of the other implementations as can be desired and advantageous for any given or particular application. It will also be recognized that the embodiments include a system as well as a computer-readable medium having computer-executable instructions for performing the acts and/or events of the various processes.

What is claimed is:

1. A non-volatile memory logic system, comprising:
   bit lines and a set of wordlines;
   a set of resistive switching memory circuits at respective intersections between the bit lines and the set of wordlines, wherein resistive switching memory cells within the set of resistive switching memory circuits are programmed with respective bit values corresponding to a first data matrix, and wherein a second data matrix, represented by a set of electrical currents input onto wordlines of the set of wordlines, is provided to the non-volatile memory logic system as a system input, and
   wherein, in response to an input of the second data matrix and a programming of the resistive switching memory cells to the first data matrix, the non-volatile memory logic system generates an output on the bit lines and wherein each resistive switching memory circuit of the set of resistive switching memory circuits respectively includes a resistive switching memory cell of the resistive switching memory cells and at least one transistor device directly or indirectly responsive to a value stored at the resistive switching memory cell.

2. The non-volatile memory logic system of claim 1, wherein the output is a dot product multiplication result of the first data matrix and the second data matrix.

3. The non-volatile memory logic system of claim 1, wherein different dot product results for the first data matrix are obtained based on second data matrices applied to the set of wordlines.

4. The non-volatile memory logic system of claim 1, wherein the resistive switching memory circuit comprises a resistive switching memory cell coupled at a first terminal to an electrical ground or low voltage source and coupled at a second terminal to a channel node of the at least one transistor device, wherein a second channel node of the at least one transistor device is connected to a bit line of the bit lines and a gate node of the at least one transistor device is connected to a wordline of the set of wordlines.

5. The non-volatile memory logic system of claim 1, wherein the first data matrix programmed to the set of resistive switching memory circuits is a two-dimensional matrix.

6. The non-volatile memory logic system of claim 1, wherein the output is provided by respective output currents on the bit lines.

7. The non-volatile memory logic system of claim 6, wherein the respective output currents on the bit lines are a function of an electrical voltage or a current input on the set of wordlines and respective resistive states of a set of resistive switching memory cells.

8. The non-volatile memory logic system of claim 1, wherein a wordline of the set of wordlines having a high logic value and a resistive switching memory circuit having a high logic value generate a low resistance path to ground resulting in a first range of current on a bit line.

9. The non-volatile memory logic system of claim 8, wherein a second resistive switching memory circuit having the high logic value on a second wordline of the set of wordlines, the second wordline receiving the high logic value in response to the first data matrix, generates another low resistance path to ground in a second range of current on the bit line, wherein the first range of current and the second range of current are additive currents.

10. The non-volatile memory logic system of claim 1, wherein the resistive switching memory circuit comprises an inverter, the resistive switching memory cell and the at least one transistor device which includes a first transistor device and a second transistor device, and further wherein:
    a first terminal of the resistive switching memory cell is coupled to ground or a low voltage source and a second terminal of the resistive switching memory cell is coupled to a first channel node of the first transistor device;
    a gate node of the first transistor device is coupled to a wordline of the set of wordlines;
    a second channel node of the first transistor device is coupled to a shared node coupling:
    the second channel node of the first transistor device, an input of the inverter and a selectively controlled voltage source;
    an output of the inverter is coupled to a gate node of the second transistor device;
    a first channel node of the second transistor device is coupled to ground or the lower voltage source; and
    a second channel node of the second transistor device is coupled to a bit line of the bit lines.

11. The non-volatile memory logic system of claim 1, wherein the resistive switching memory circuit comprises the resistive switching memory cell coupled at a second terminal thereof to a second terminal of a second resistive switching memory cell forming a common node serving as a direct or indirect input to the at least one transistor device, a voltage source is selectively connected to a first terminal of the resistive switching memory cell and a ground or low voltage is selectively connected to a first terminal of the second resistive switching memory cell, causing a voltage at the common node to depend in part on a value stored at the resistive switching memory cell and affecting the direct or indirect input to the at least one transistor device.

12. The non-volatile memory logic system of claim 1, wherein a dot product of the first data matrix programmed to the resistive switching memory circuits and a second data matrix of electrical currents on the set of wordlines is based on a measurement of respective numbers of units of current on one or more bit lines of the bit lines.

13. A method, comprising:
programming a set of resistive switching memory circuits with respective bit values corresponding to a first data matrix, wherein the set of resistive switching memory circuits are located at respective intersections between bit lines and a set of wordlines, and wherein each resistive switching memory circuit of the set of resistive switching memory circuits is coupled to a bit line of the bit lines and to a wordline of the set of wordlines and comprises at least one transistor and at least one resistive memory cell, wherein the at least one transistor is directly or indirectly responsive to a value stored at the at least one resistive switching memory cell;
inputting a set of electrical currents onto wordlines of the set of wordlines, wherein the set of electrical currents represents a second data matrix; and
generating an output on the bit lines based on the inputting of the second data matrix and the programming the resistive switching memory circuits to the first data matrix.

14. The method of claim 13, wherein the generating the output comprises generating respective current values on the bit lines that represent a dot product multiplication result of the first data matrix and the second data matrix.

15. The method of claim 13, wherein the generating the output comprises obtaining different dot product results for the first data matrix in response to inputting different instances of the second data matrix, respectively corresponding to different sets of electrical currents, to the set of wordlines.

16. The method of claim 13, wherein respective resistive switching memory circuits are coupled at respective first nodes thereof to respective bit lines of the bit lines and at respective second nodes thereof to respective wordlines of the set of wordlines.

17. The method of claim 13, wherein the first data matrix programmed to the set of resistive switching memory circuits is a two-dimensional matrix.

18. The method of claim 13, wherein the first data matrix is a data filter.

19. The method of claim 13, wherein the facilitating the generation of the output comprises:
facilitating a first programming operation that sets resistive switching memory circuits to the first data matrix; and
obtaining a first set of multiple dot product results of the first data matrix based on the first programming operation.

20. The method of claim 19, further comprises:
inputting a sequence of second data matrices on the set of wordlines; and
obtaining a second set of multiple dot product results of second data matrices based on the inputting the sequence of second data matrices.

* * * * *